(12) United States Patent
Nishioka

(10) Patent No.: US 9,722,128 B2
(45) Date of Patent: Aug. 1, 2017

(54) SOLAR POWER SYSTEM AND SOLAR PANEL INSTALLATION METHOD

(71) Applicant: Itogumi Construction Co., Ltd., Sapporo-shi, Hokkaido (JP)

(72) Inventor: Makoto Nishioka, Sapporo (JP)

(73) Assignee: ITOGUMI CONSTRUCTION CO., LTD., Sapporo-shi, Hokkaido (JP)

(*) Notice: Subject to any disclaimer, the term of this patent is extended or adjusted under 35 U.S.C. 154(b) by 76 days.

(21) Appl. No.: 14/362,453

(22) PCT Filed: Dec. 3, 2012

(86) PCT No.: PCT/JP2012/081249
§ 371 (c)(1),
(2) Date: Jun. 3, 2014

(87) PCT Pub. No.: WO2013/084837
PCT Pub. Date: Jun. 13, 2013

(65) Prior Publication Data
US 2014/0338732 A1 Nov. 20, 2014

(30) Foreign Application Priority Data
Dec. 6, 2011 (JP) .................................. 2011-266483

(51) Int. Cl.
*H02S 20/30* (2014.01)
*H02S 20/10* (2014.01)
(Continued)

(52) U.S. Cl.
CPC .............. *H01L 31/18* (2013.01); *F24J 2/523* (2013.01); *F24J 2/5232* (2013.01); *F24J 2/5264* (2013.01);
(Continued)

(58) Field of Classification Search
CPC ......... F24J 2002/5283; F24J 2002/5284; F24J 2002/0053; F24J 2002/0069; F24J 2002/0046; F24J 2002/0038; F24J 2002/0076; F24J 2/0455; F24J 2/523–2/5239
See application file for complete search history.

(56) References Cited

U.S. PATENT DOCUMENTS 5,143,556 A * 9/1992 Matlin .................. F24J 2/5232
136/244
2009/0145423 A1* 6/2009 Carcangiu .............. F24J 2/5264
126/600
(Continued)

FOREIGN PATENT DOCUMENTS

JP 2000-080773 A 3/2000
JP 2000080773 A * 3/2000
(Continued)

OTHER PUBLICATIONS

Machine translation of JP2000-080773A.*

*Primary Examiner* — Eric R Smith
(74) *Attorney, Agent, or Firm* — Muncy, Geissler, Olds & Lowe, P.C.

(57) ABSTRACT

[Problem] To provide a solar power system and a solar panel installation method with which, by using a positioning configuration which is not prone to visible vertical misalignment while preserving sunlight lighting efficiency in the positioning of a plurality of solar panels, solar panel installation is easy, and which is suitable to installing a large solar power system on a hill, in wetlands, etc. [Solution] A solar power system comprises a solar panel group (2) in which a plurality of vertically oriented rectangular solar panels (21) are inclined in the same direction, either left or right, at a prescribed angle of inclination (theta), and the lighting faces (22) of each of the solar panels (21) are arrayed in the same plane.

12 Claims, 23 Drawing Sheets

(51) Int. Cl.
    *F24J 2/52*      (2006.01)
    *H01L 31/18*     (2006.01)
    *F24J 2/54*      (2006.01)
    *F24J 2/00*      (2014.01)

(52) U.S. Cl.
    CPC .............. H02S 20/10 (2014.12); H02S 20/30 (2014.12); *F24J 2/54* (2013.01); *F24J 2002/0084* (2013.01); *Y02B 10/12* (2013.01); *Y02E 10/47* (2013.01); *Y10T 29/49355* (2015.01)

(56)             References Cited

U.S. PATENT DOCUMENTS

| | | | |
|---|---|---|---|
| 2010/0018570 A1* | 1/2010 | Cashion | F24J 2/5424 136/246 |
| 2010/0217724 A1* | 8/2010 | Wayne et al. | 705/348 |
| 2011/0047891 A1* | 3/2011 | Andretich | F24J 2/5264 52/79.5 |
| 2012/0272591 A1* | 11/2012 | Posnansky | E04D 1/125 52/173.3 |
| 2012/0285515 A1* | 11/2012 | Sagayama | F24J 2/5211 136/251 |

FOREIGN PATENT DOCUMENTS

| | | | | |
|---|---|---|---|---|
| JP | 2010-209515 A | 9/2010 | | |
| WO | WO 2009124409 A2 * | 10/2009 | | E04D 1/125 |
| WO | WO 2011078382 A1 * | 6/2011 | | F24J 2/5211 |

* cited by examiner

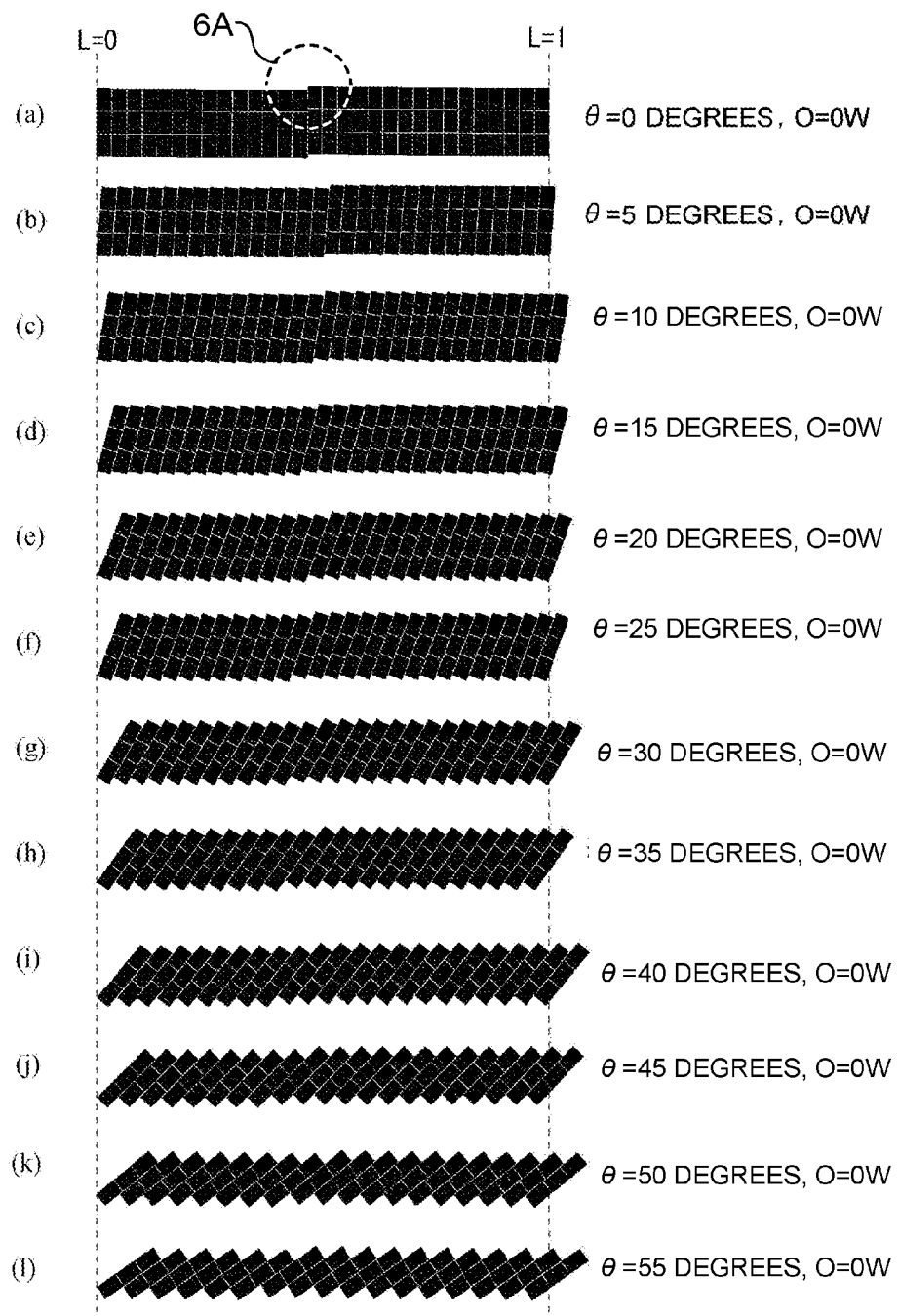

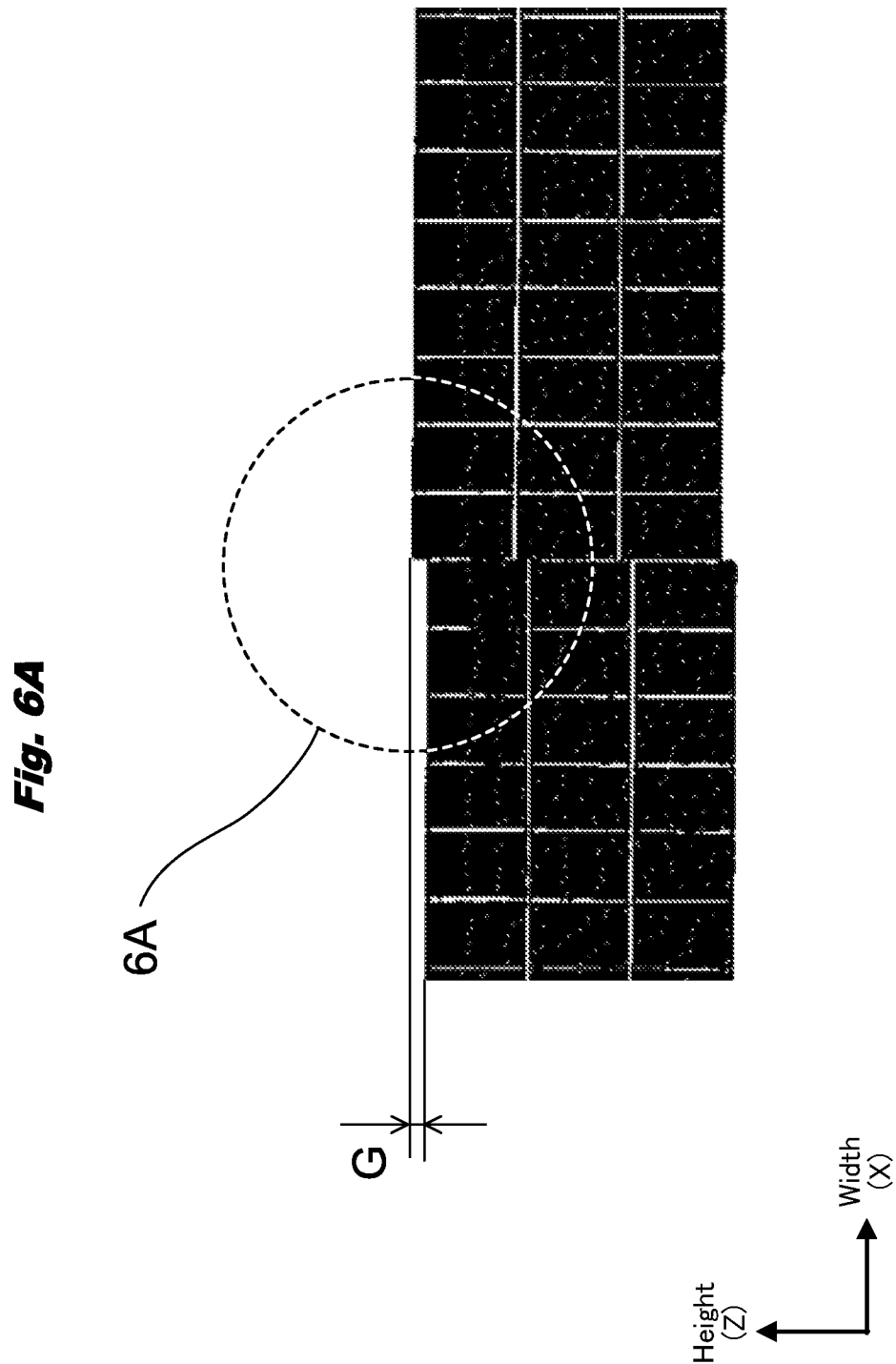

(X, Y, Z) = (X-coordinate, Y-coordinate, Z-coordinate)

SOLAR POWER SYSTEM AND SOLAR PANEL INSTALLATION METHOD

TECHNICAL FIELD

The present invention relates to an installation method of a solar power system having a plurality of solar panels, and a solar panel.

BACKGROUND ART

Conventionally, a plurality of solar panels used in a solar power system are installed by being arranged in an orderly manner without providing level-differences or clearances in vertical and horizontal directions.

For example, there proposed a solar panel mounting method in Japanese Patent Laid-Open No. 2010-209515 in which rectangular solar panels are arranged on top of a frame provided on the roof of a building without providing level-differences or clearances (Patent Literature 1). It is necessary to make the size compact by removing level-differences or clearances since the area on the roof is limited, and in consideration of appearance, a solar panel group arranged in an orderly manner without providing level-differences or clearances features a beautiful appearance to see since the panel group is installed at a conspicuous location on the roof.

CITATION LIST

Patent Literature

Patent Literature 1: Japanese Patent Laid-Open No. 2010-209515

SUMMARY OF INVENTION

Technical Problem

However, the invention described in Patent Literature 1 requires a large amount of cost and labor because high construction accuracy from frame installation to mounting work must be secured in order to keep the beauty of appearance. In particular, in a plurality of solar panels arranged in an orderly manner, when a level-difference is caused by a vertical misalignment between each of adjacent solar panels, and a level-difference is caused in the inclined face by a misalignment between each of solar panels in the front-back direction, these level-differences become conspicuous and give an impression of an unattractive appearance.

Furthermore, demands for electric power generation using clean energy are increasing in recent years and a large-scale solar power system is planned. Therefore, it is thought that an installation location for the solar power system should not be limited to a comparatively stable location such as on a roof, but unused lands such as a hilly area or a wet area should be utilized.

However, when the solar power system is installed on a hilly area or a wet area, it is extremely difficult to construct the frame horizontally in the conventional way. That is, when a conventional system is adopted, the hilly area must be leveled first in order to install the solar panels horizontally on the hilly area, which wastes a great cost and time. When installing on a soft ground such as a wet area, the frame is possible to incline due to a subsidence of the foundation etc. even if constructed with high accuracy.

Additionally, when the plurality of solar panels that configure the solar panel group is partly out of order or damaged, it should be sufficient to exchange only some part of the panels, but the size slightly differs since a standard on size is not necessarily unified in all the manufacturers, and it is possible that the standard may be changed even in the same manufacturer. In such a case, all of the solar panels must be exchanged in order not to generate a level-difference or a clearance between the solar panels.

The present invention is provided to solve such problems. It is an object of the present invention to facilitate solar panel installation by using an arrangement configuration in which it is hard to recognize level-differences in the vertical direction and level-differences of the inclined face, a difference in an inclination angle of each of the solar panels either inclined left or right, and a difference in a clearance between each of the solar panels, while maintaining lighting efficiency of the sunlight in an arrangement of the plurality of solar panels, and to provide a suitable method for installing the solar power system and the solar panels in a case when an upsizing solar system is installed on a hilly area, a wet area, or the like.

Solution to Problem

A solar power system according to the present invention includes a solar panel group in which a plurality of vertically oriented rectangular solar panels are inclined in the same direction either left or right at a predetermined inclination angle, and a lighting face of each of the solar panels is arranged in a same plane.

Furthermore, as an aspect of the present invention, the inclination angle of each of the solar panels that configure the solar panel group may be between 15 degrees and 45 degrees.

Additionally, as an aspect of the present invention, a clearance equal to or smaller than the width of the solar panel may be provided between each of the solar panels that configure the solar panel group.

In the installation method of the solar panel according to the present invention, a plurality of vertically oriented rectangular solar panels are inclined in the same direction either left or right at a predetermined inclination angle, and the lighting face of each of the solar panels are arranged in the same plane.

Furthermore, as an aspect of the present invention, the inclination angle of each of the solar panels may be set to between 15 degrees and 45 degrees.

Additionally, as an aspect of the present invention, the solar panels may be arranged so that a clearance equal to or smaller than the width of the solar panel is provided between each of the solar panels.

Advantageous Effect of Invention

According to the present invention, it is possible to facilitate solar panel installation and to install an upsizing solar system on a hilly area, a wet area, or the like by using arrangement configuration in which it is hard to recognize level-differences in a vertical direction and level-differences of an inclined face, a difference in an inclination angle of each of the solar panels in either cases of inclined to left or right, and a difference in a clearance between each of solar panels, while maintaining lighting efficiency of the sunlight in an arrangement of the plurality of solar panels.

BRIEF DESCRIPTION OF DRAWINGS

FIG. 6 is a view showing visual relations between level-differences and inclination angles of the solar panel group according to the example 1.

FIG. 6A is an enlarged view of circle 6A in FIG. 6, illustrating a level-difference G formed by adjacent two panels in a height direction.

DESCRIPTION OF EMBODIMENTS

Figure 1:
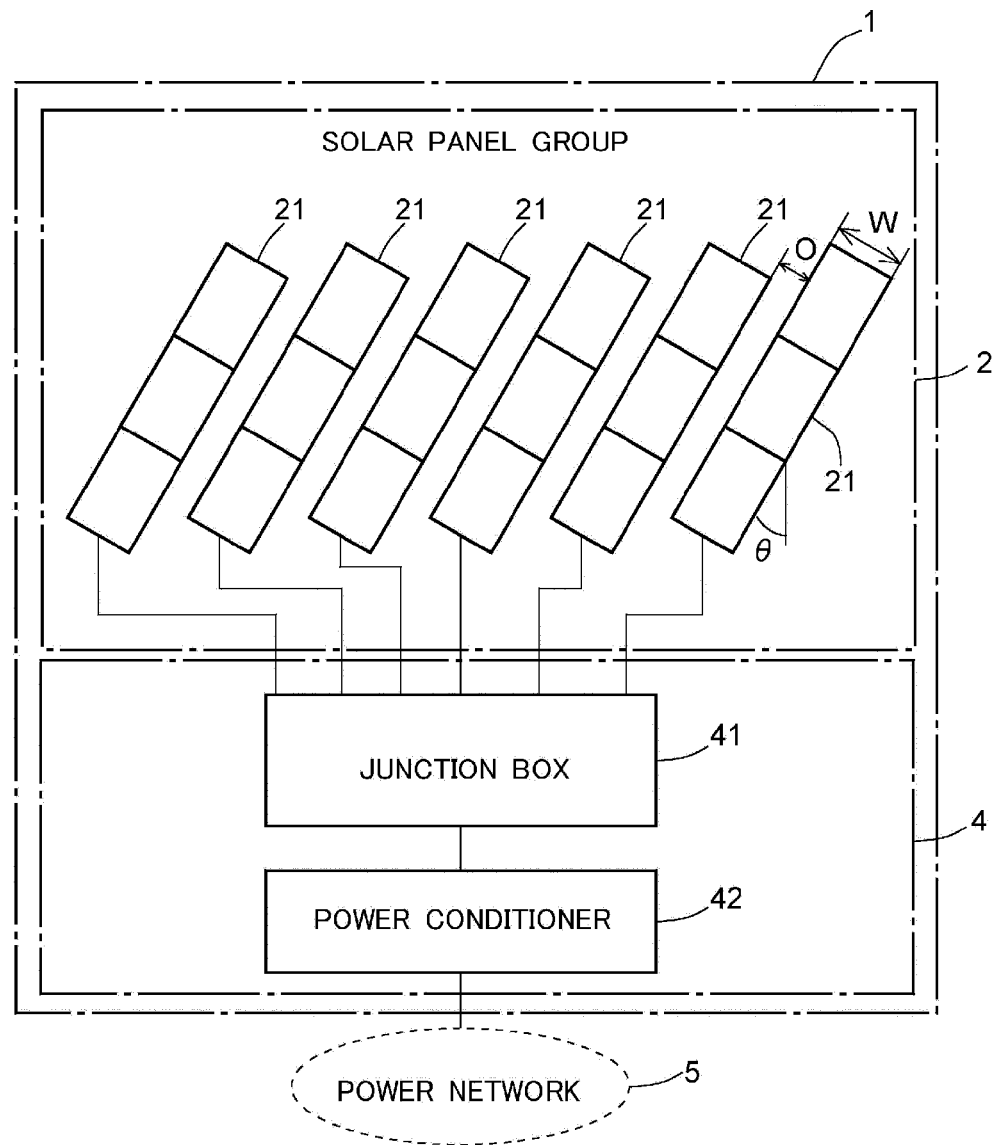
FIG. 1 is a block diagram showing an embodiment of a solar power system according to the present invention.
Figure 2:
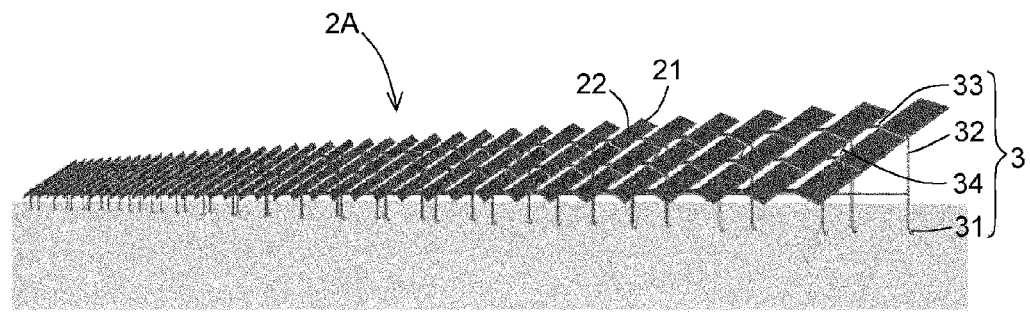
FIG. 2 is an overall perspective view showing a solar panel group according to the embodiment.

The following describes an embodiment of an installation method of a solar power system and a solar panel according to the present invention with reference to the drawings. FIG. 1 is a block diagram showing each configuration of a solar power system 1 according to the embodiment. FIG. 2 is an overall perspective view showing a solar panel group 2A according to the embodiment and FIG. 3 is a partially enlarged perspective view of FIG. 2.

Figure 3:
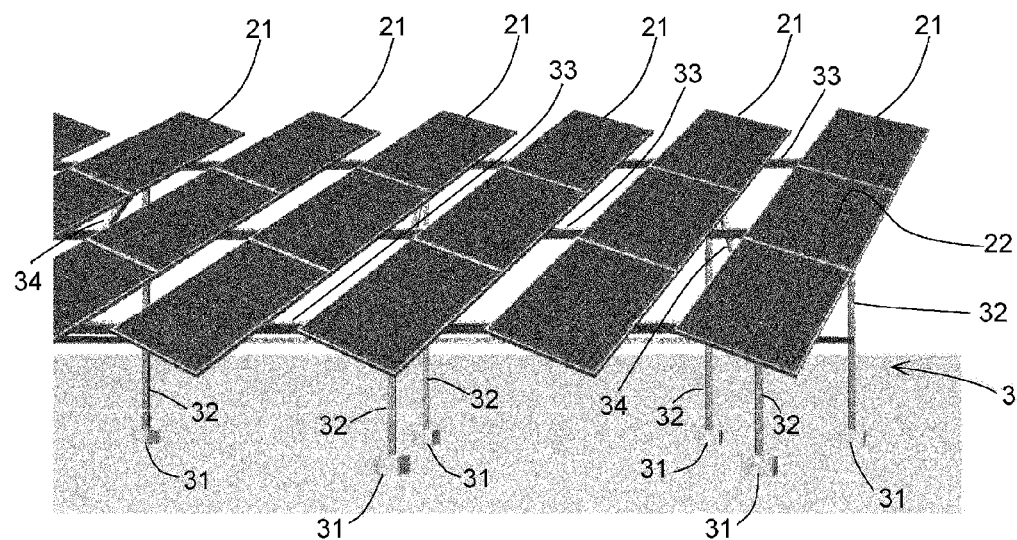
FIG. 3 is a partially enlarged perspective view showing a solar panel group according to the embodiment.

The solar power system 1, as shown in FIGS. 1 to 3, generally includes a plurality of solar panels 21, 21 . . . , a frame 3 for installing each of solar panels 21, 21 . . . and a current collector 4 that collects a DC current generated by each of the solar panels 21, 21 . . . and transmits to a power network 5 etc. The following describes each configuration in detail.

The solar panel 21 is a solar panel generally available on the market. As shown in FIGS. 2 and 3, the top side of the solar panel 21 is a lighting face 22 which serves to receive the sunlight and the DC current is generated by receiving the sunlight on the lighting face 22.

The solar panel 21 according to the embodiment is formed in a vertically oriented rectangular shape and an aspect ratio thereof is approximately 1.5:1. The solar panels 21 are unitized by arranging consecutive three sheets in a horizontal direction, and formed in a vertically oriented rectangular shape with an aspect ratio approximately 4.5:1. In the embodiment, as shown in FIGS. 2 and 3, the solar panel group 2A is configured by arranging and installing the large number of solar panels 21, 21 . . . formed in a vertically oriented rectangular shape in the horizontal direction. Expansion of the solar panel group 2A to the horizontal direction is limited by arranging and unitizing the solar panels 21 in the vertical direction, which allows securing adequate amount of power generation.

Note that a size and an aspect ratio of the solar panel 21 are not particularly to be limited and should be selected as appropriate. The solar panel group 2A may not only be configured by three-sheet solar panels 21 but also be configured by arranging one-sheet vertically oriented rectangular solar panel 21 in the horizontal direction if adequate amount of power generation can be secured. In addition, the number of the solar panels 21 arranged in the vertical direction should be determined as appropriate in consideration of desired amount of power generation, a wind force received on the solar panel 21, an amount of snow accumulated on the solar panel 21 etc., which means two sheets is acceptable and four sheets or more is also acceptable.

Next, each solar panels 21, 21 . . . that configures the solar panel group 2A is installed to the frame 3 using the following installation method in order to be visually hard to recognize by making inconspicuous the level-differences in the vertical direction and level-differences of the inclined face occurring between arranged solar panels 21, a difference in an inclination angle θ of each of the solar panels in a case when inclined either left or right, and a difference in clearance O between each of the solar panels.

Figure 4A:
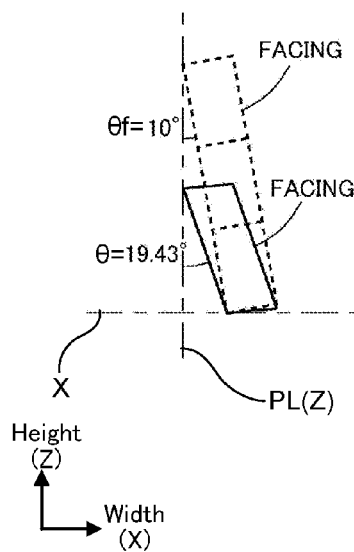
FIG. 4A is a view showing a difference in angles between a solar panel and a perpendicular line in cases facing to the front and facing to the lighting face, FIG. 4B and is a side view of FIG. 4A according to the embodiment.
Figure 4B:
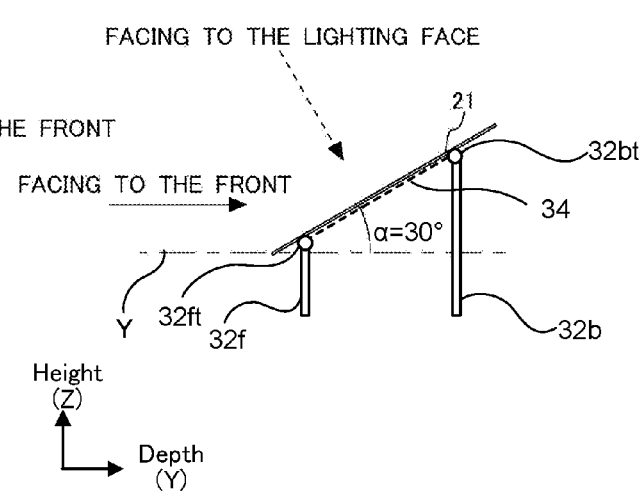

First, each of solar panels 21, 21 . . . is installed inclining at the predetermined inclination angle θ in the same direction either left or right. Note that the solar panel 21 is, as shown in FIGS. 2 and 3, installed on a hereinafter described inclination portion 34 of the frame 3. Therefore, apparent angles of the solar panel 21 differ from the angle to be seen from. For example, as shown FIGS. 4A and 4B, when the solar panel 21 with an aspect ratio approximately 5:1 is mounted on the inclination portion 34 inclined at 30 degrees (or light facing angle), the angle θ between the solar panel 21 and a perpendicular line PL is approximately 19.4 degrees in a case facing to the front of the solar panel 21, while the angle θf is approximately 10 degrees in a case facing to the lighting face 22 of the solar panel 21. Therefore, in the present invention, the inclination angle θ is defined as an angle created by the solar panel 21 and the perpendicular line in a case facing to the front of the solar panel group 2, in consideration of the actual condition in which the solar panel group 2 is viewed. Each of the solar panels 21, 21 . . . according to the embodiment is, as shown in FIGS. 2 and 3, installed inclining rightward. FIG. 4B, the inclination portion 34 is further illustrated. The inclination portion 34 functions as a light facing plane which is designed to be set to face the sun when the frame is installed on the ground. The light facing plane is an imaginary plane that can be determined by at least two parts of the frame 3. In the embodiment, one part is a tip portion 32ft of front frame body 32f, which is a lower and front side of the frame. The other part is a tip portion 34bt of back frame body 32b, which is an upper and back side of the frame. The light facing angle of the light facing plane, which is defined with respect to a depth direction (Y), is denoted with reference α. As shown in FIGS. 4A and 4B, the depth direction (Y) means a horizontal direction from the front to the back of the frame, the width direction (X) means another horizontal direction from the right to let (or lateral) of the frame, the height direction (Z) means a perpendicular direction to the horizontal direction. In the invention, the tem, "horizontal," may be defined as parallel to the ground below the panels, or may be determined by a direction which is perpendicular to the gravity direction. The height direction can be defined according to the definition of the horizontal direction.

As to the inclination angle θ of each of the solar panels 21, 21 . . . , as the angle of inclination increases, it gets visually harder to recognize level-differences in the vertical direction and level-differences of the inclined face occurring between the solar panels 21, and a difference in the inclination angle θ and a difference in the clearance O. On the other hand, as the angle of inclination increases, because the solar panel 21 is formed in a vertically oriented rectangular shape, the width of the solar panel group 2A expands, which requires a larger installation location. Therefore, in consideration of a balance between a visual effect of being hard to recognize a level-difference, and the installation location, the inclination angle θ between 15 degrees and 45 degrees is preferred, that between 20 degrees and 40 degrees is more preferred, and that of approximately 30 degrees is even more preferred.

Figure 5:
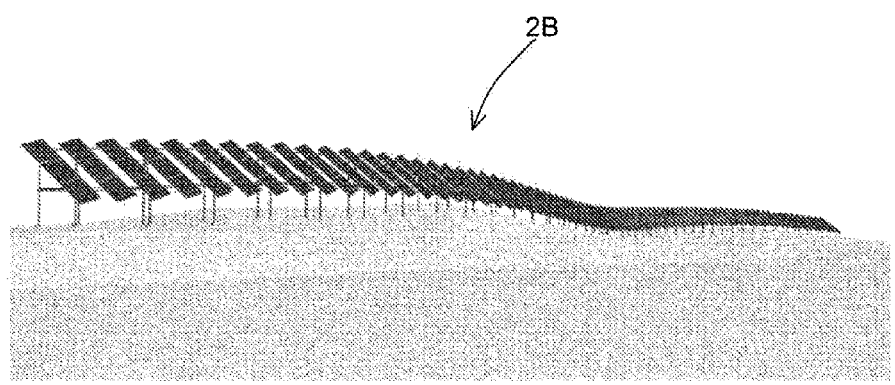
FIG. 5 is an overall perspective view showing a solar panel group according to another embodiment, the group including 20 or more solar panels arranged in a single row.

Furthermore, each of the solar panels 21 of the solar panel group 2A is arranged with the lighting faces 22 arranged in the same plane so that adjacent solar panels 21 may not overlap and make a shadow on another solar panel 21. It is done in order to maintain the lighting efficiency in each of solar panels 21, 21 . . . . Note that the same plane where each of the solar panels 21, 21 . . . are arranged may be a linear plane shape as shown in the embodiment and also may be a curved plane shape as shown in FIG. 5.

Additionally, each of the solar panels 21, 21 . . . is arranged by providing a clearance O which is equal to or smaller than a width W of the solar panel 21 between every panel. As the clearance O increases, it becomes visually harder to recognize level-differences in the vertical direction and level-differences of the inclined face, and difference in the inclination angle θ and the difference in the clearance O occurring between the solar panels 21. Therefore, the clearance O according to the embodiment serves to increase a visual effect of being hard to recognize the level-differences and the differences in the inclination angle θ etc. caused by inclining the solar panels 21. On the other hand, a larger width of the clearance O requires a larger installation location because the width of the solar panel group 2A expands. Therefore, in consideration of a balance between a visual effect of being hard to recognize the level-differences and the differences in the inclination angle θ etc., and the installation location, it is preferred that the clearance O is equal to or smaller than the width W of the solar panel 21.

Next, the frame 3 according to the embodiment is described.

The frame 3 is a stand for inclining the plurality of solar panels 21, 21 . . . at the predetermined inclination angle θ using the above-mentioned installation method, arranging the lighting faces 22 of each of the solar panels 21, 21 . . . in the same plane, and arranging the panels by providing the clearance O. The frame 3 according to the embodiment, as shown in FIGS. 2 and 3, includes a base portion 31 buried at the installation location, a frame body 32 installed on the base portion 31, and a panel installation rail 33 for installing each of solar panels 21, 21 . . . , by forming the same plane on the frame body 32.

The base portion 31 is buried in the installation location and serves to support the frame body 32 etc. Note that the construction method and configuration for the base portion 31 are chosen as appropriate in consideration of a status of a foundation of the installation location etc., and a simple foundation construction method etc. using such as spherical foundation which is installable in a concrete foundation or a soft ground can be used.

The frame body 32 serves to support the solar panels 21 and is formed of a frame structure in order to secure the strength to support the solar panel 21 and to reduce a force caused by a wind and a weight of accumulated snow. Additionally, the frame body 32 includes the inclination portion 34 that forms an inclination face by inclining a top of the solar panel 21 backward at an angle based on latitude of the installation location in order to increase the lighting effect of the solar panel 21.

The panel installation rail 33 is fixed on the inclination portion 34 of the frame body 32, and serves to install each of solar panels 21, 21 . . . in the same plane. In the embodiment, as shown in FIGS. 2 and 3, the frame is configured of three rails that are placed vertically side by side in order to install each of the solar panels 21, 21 . . . in a stable manner.

Note that the frame 3 may not be limited to the above configuration but also may be installed one by one with solar panel 21.

The current collector 4 serves to collect the DC current generated by each of the solar panels 21, 21 . . . and transmit to the power network 5 etc. The embodiment, as shown in FIG. 1, includes a junction box 41 for collecting the generated DC current, and a power conditioner 42 which converts the DC current collected by the junction box 41 to an AC current and performs a system interconnection to power networks such as commercial electrical distribution system.

Note that the DC current generated by each of the solar panels 21, 21 . . . may be stored in a storage battery or may be supplied directly to an electric appliance. Additionally, although not illustrated, it is also allowed to transmit electricity to a plurality of systems, electric appliances etc. in parallel or by switching to each by providing a distribution board.

Next, effects given by the inclination angle θ and the clearance O of the solar panel group 2A according to the solar power system 1 of the embodiment are described in detail.

A general effect given by installing the solar panel group 2A at an inclination angle θ is, as mentioned above, to make visually inconspicuous and hard to recognize level-differences in the vertical direction and level-differences of the inclined face, differences in the inclination angle θ and differences in the clearance O that cause in each of the solar panels 21, 21 . . . . Therefore, when the solar panel 21 is installed on the frame 3, especially high levels of construction accuracy in the vertical direction and in the inclined face and for the inclination angle θ etc. are not required, which facilitates the construction. Additionally, even if solar panels 21 slightly different in size are used, the differences in size among the solar panels 21 are inconspicuous.

A general effect given by installing the solar panels 21 by providing the clearances O therebetween is, similar to the effect of providing the inclination angle θ, to make it hard to recognize level-differences in the vertical direction and level-differences of the inclined face, differences in the inclination angle θ and differences in the clearance O occurring between the solar panels 21. Therefore, the clearance O in the embodiment can increase more the visual effect of being hard to recognize level-differences in the vertical direction and level-differences of the inclined face, the differences in the inclination angle θ and the differences in the clearance O by providing the inclination angle θ. Furthermore, it is possible to prevent a dangerous damage or collapse by a wind force by providing the clearance O between each of the solar panels 21, 21 . . . , since the wind can escape through the clearance O. Moreover, the clearance O prevents snow from accumulating easily on the lighting face 22 of the solar panel 21.

Additionally, the solar panels 21 match the scenery and look visually beautiful by arranging in the same plane, as shown in FIGS. 2 and 5.

The following describes effects of each configuration during generating electricity according to the solar power system 1 of the embodiment.

The solar panel group 2A according to the embodiment generates a DC current by receiving sunlight on the lighting faces 22. The DC current generated by each of the solar panels 21, 21 . . . is collected to the junction box 41 in the current collector 4 and transmitted to the power conditioner 42. In the power conditioner 42, the DC current generated by each of the solar panels 21, 21 . . . is then converted to an AC current and transmitted to the power network 5.

Here, the solar panel 21 according to the embodiment has no chance to make a shadow by overlapping between the solar panels 21 because the panels are arranged in the same plane, which can maintain the lighting efficiency of the sunlight.

In addition, in the embodiment, since a large amount of lighting area with a predetermined width can be secured by configuring the solar panel 21 in a vertically oriented rectangular shape, expansion of the installation location in the horizontal direction caused by the provided clearance O may be limited and sufficient amount of power generation may be secured.

The above method for installing the solar power system 1 and the solar panel 21 according to the embodiment may obtain the following effects.

1. Since a level-difference in the vertical direction and a level-difference of the inclined face, a difference in an inclination angle θ, and a difference in a clearance O between adjacent solar panels 21 are made to be inconspicuous, even if positions between each of the solar panels 21 are misaligned to some extent, both functional and apparent problems may not occur and it may become easy to align the base portion 31 and the frame body 32. That is, since construction accuracy has a margin, the construction can be performed simply and quickly.

2. Even if a level-difference or a difference in the inclination angle θ etc. is caused by such as a ground subsidence after construction, they are apparently inconspicuous and the solar panel can match the scenery and can visually maintain the beauty.

3. When a part of the solar panel group 2A is replaced to a solar panel 21 slightly different in size, it is inconspicuous and hard to recognize even if there is a level-difference.

4. Since each of the solar panels 21, 21 . . . is arranged in the same plane, the lighting efficiency of the sunlight can be maintained.

5. Amount of power generation can be secured by forming the solar panel 21 in a vertically oriented rectangular shape without making a vertical misalignment conspicuous.

Next, studies were performed regarding effects that the installation method of the solar power system 1 and the solar panel 21 according to the present invention makes a level-difference of the solar panels 21 visually inconspicuous, which are described in each of the following examples.

Example 1

In an example 1, a study was performed regarding a visual relation between a level-difference G, which is more apparently illustrated in FIG. 6A, and an inclination angle θ caused in a solar panel group 2. In the example 1, a set of solar panels 21 formed of three sheets of solar panels 21 with 1 W in width and 1.5 W in height in the vertical direction were arranged in the horizontal direction without a clearance, which formed the solar panel group 2. Furthermore, a level-difference of 0.2 W in height, relative to the width W, was provided to a solar panel 21 located at a nearly center in the horizontal direction. Additionally, each of the solar panels 21, 21 . . . was inclined rightward with an inclination angle θ increased from 0 degrees to 55 degrees in increments of 5 degrees.

FIG. 6 illustrates each of arranged solar panel group 2 indicating results according to the example 1. In FIG. 6, (a) denotes a case that inclination angle θ=0 degrees, (b)

denotes a case that inclination angle θ=5 degrees, (c) denotes a case that inclination angle θ=10 degrees, (d) denotes a case that inclination angle θ=15 degrees, (e) denotes a case that inclination angle θ=20 degrees, (f) denotes a case that inclination angle θ=25 degrees, (g) denotes a case that inclination angle θ=30 degrees, (h) denotes a case that inclination angle θ=35 degrees, (i) denotes a case that inclination angle θ=40 degrees, (j) denotes a case that inclination angle θ=45 degrees, (k) denotes a case that inclination angle θ=50 degrees, and (l) denotes a case that inclination angle θ=55 degrees.

As shown in FIG. 6, as the inclination angle θ got larger, the level-difference became visually more inconspicuous and harder to recognize. In particular, as shown in (d) to (l) in the figure, when the inclination angle θ was equal to or larger than 15 degrees, it was hard to recognize the level-difference unless trying to find it consciously, and as shown in (g) to (l) in the figure, when the inclination angle θ was equal to or larger than 30 degrees, it was almost impossible to recognize even if seen consciously.

Accordingly, it was understood that when the inclination angle θ of the solar panels 21 that configure the solar panel group 2 was equal to or larger than 15 degrees, it was hard to recognize the level-difference, and when the inclination angle θ was equal to or larger than 30 degrees, it was almost impossible to recognize.

Example 2

In an example 2, a study was performed regarding a visual relation between a level-difference caused in a solar panel group 2 and a value of a clearance O between solar panels 21. The solar panel 21 of the example 2 was same as the solar panel 21 of the above example 1 and the solar panel group 2 was formed of the solar panels 21 with aspect ratio 4.5:1 arranged in the horizontal direction. Furthermore, a level-difference of 0.2 W in height, relative to the width W of the solar panel 21, was provided to a nearly center of the solar panel group 2 in the horizontal direction. Additionally, clearances O between 0 W and 0.7 W in increments of 0.1 W, relative to the width W, were provided between each of the solar panels 21, 21 . . . that configures the solar panel group 2.

Figure 7:
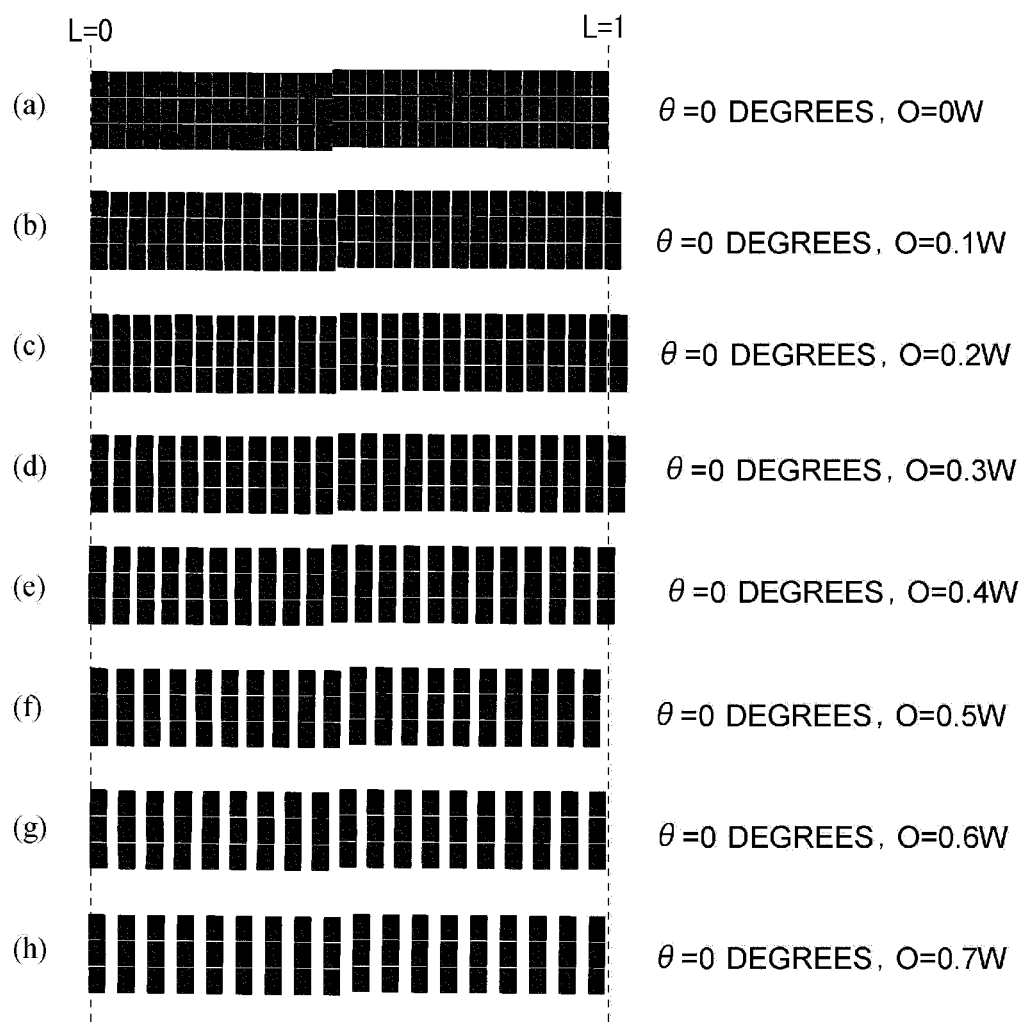
FIG. 7 is a view showing visual relations between level-differences and clearances when the inclination angles of the solar panel group according to the example 2 is 0 degrees.
Figure 8:
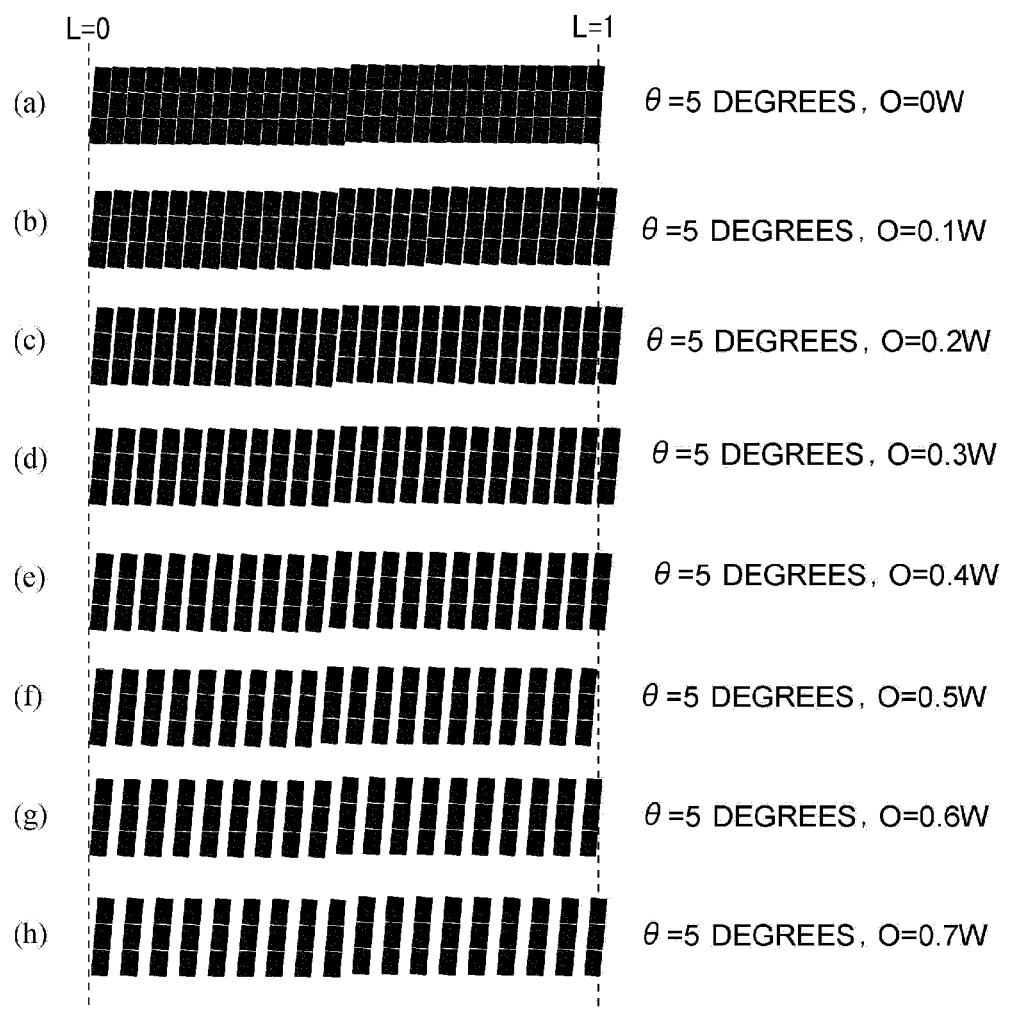
FIG. 8 is a view showing visual relations between level-differences and clearances when the inclination angles of the solar panel group according to the example 2 is 5 degrees.
Figure 9:
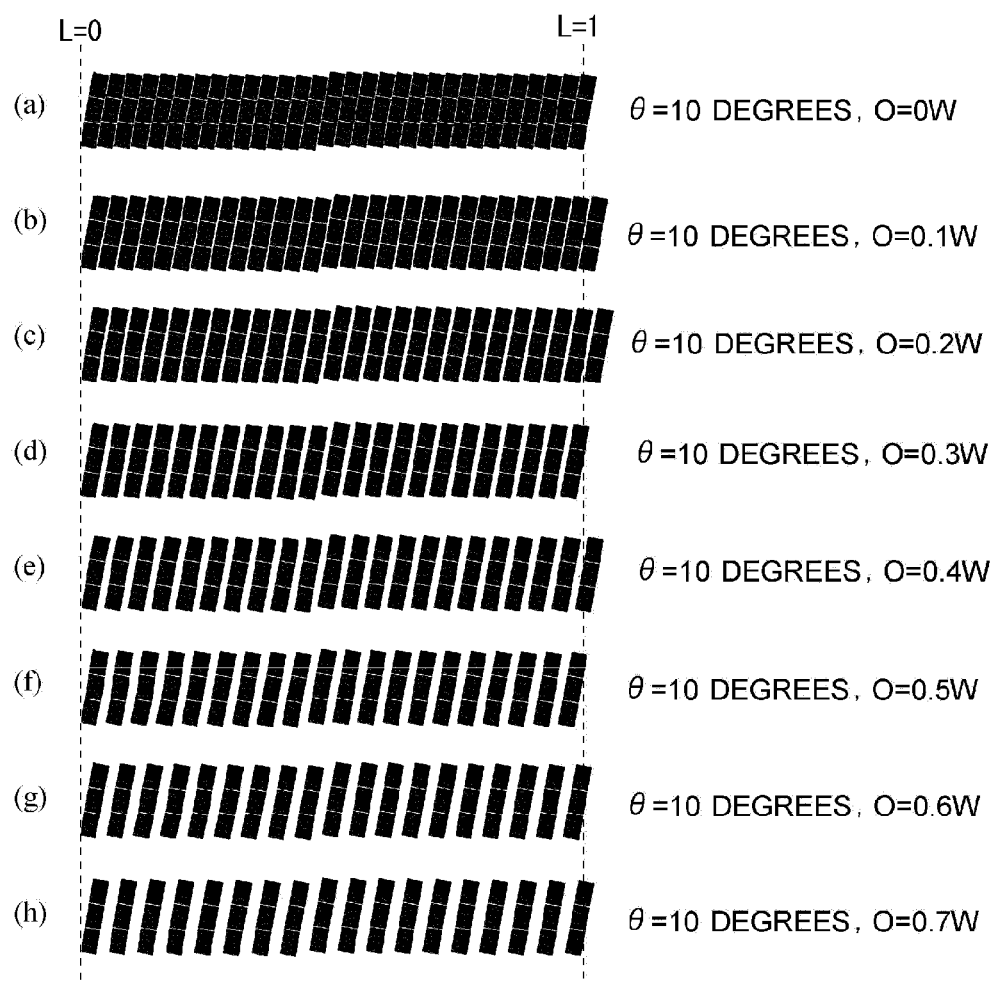
FIG. 9 is a view showing visual relations between level-differences and clearances when the inclination angles of the solar panel group according to the example 2 is 10 degrees.
Figure 10:
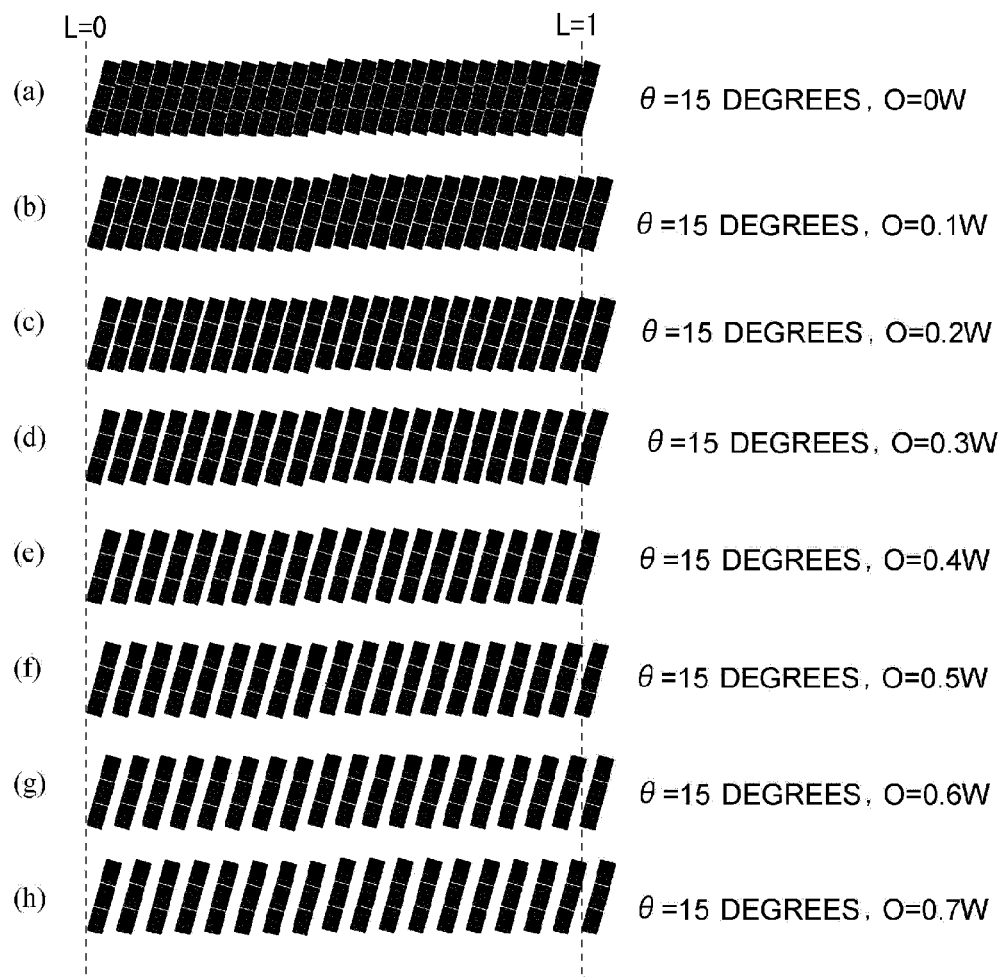
FIG. 10 is a view showing visual relations between level-differences and clearances when the inclination angles of the solar power group according to the example 2 is 15 degrees.
Figure 11:
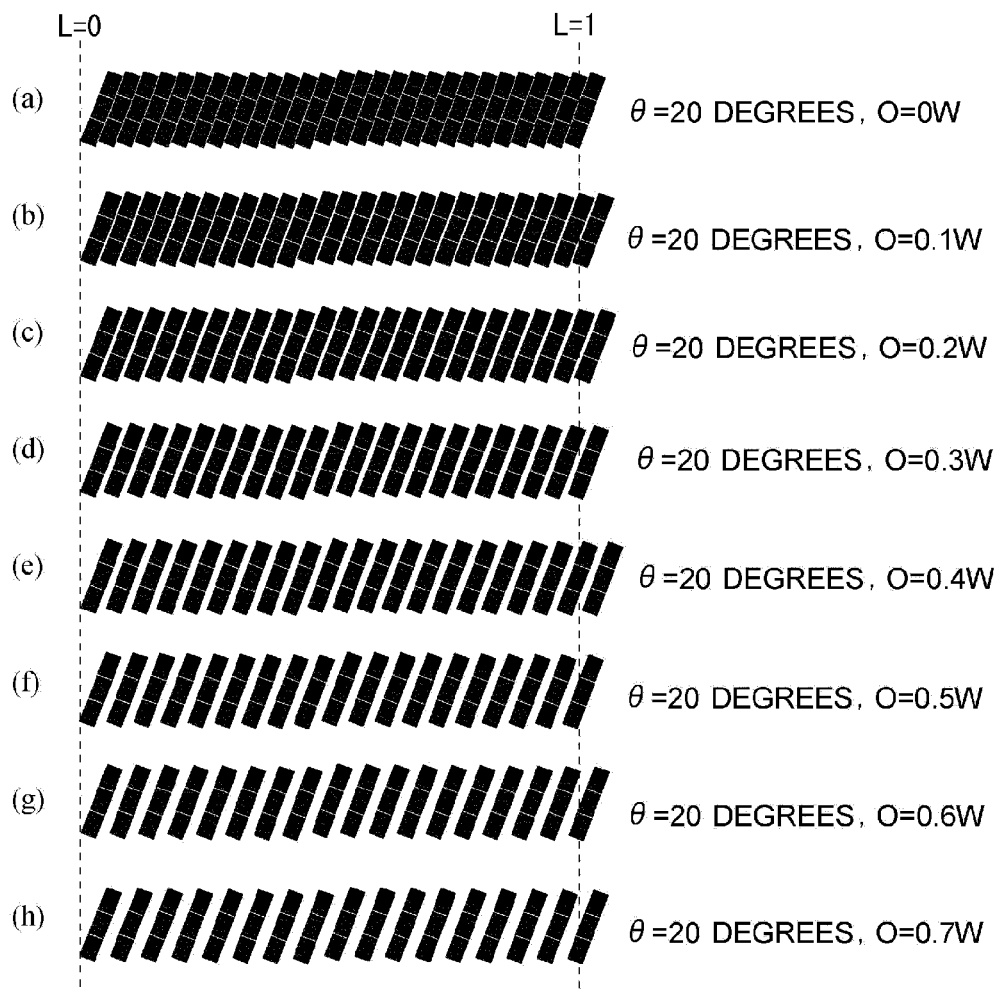
FIG. 11 is a view showing visual relations between level-differences and clearances when the inclination angles of the solar panel group according to the example 2 is 20 degrees.

FIGS. 7 to 18 illustrate each of the arranged solar panel groups 2 indicating results according to the example 2. FIG. 7 illustrates a result in a case that an inclination angle θ is 0 degrees, each item describes as follows, (a) denotes a case that the clearance O=0 W, (b) denotes a case that the clearance O=0.1 W, (c) denotes a case that the clearance O=0.2 W, (d) denotes a case that the clearance O=0.3 W, (e) denotes a case that the clearance O=0.4 W, (f) denotes a case that the clearance O=0.5 W, (g) denotes a case that the clearance O=0.6 W, and (h) denotes a case that the clearance O=0.7 W.

As shown in FIG. 7, it was understood that as the clearance O between each of the solar panels 21, 21 . . . got larger, it became harder to recognize a level-difference even in the case that the inclination angle θ was 0 degrees.

Furthermore, FIGS. 8 to 18 illustrate cases that the inclination angle θ was between 5 degrees and 55 degrees rightward and (a) to (h), similarly to FIG. 7, indicate cases that the clearances O between the solar panels 21 are between 0 W and 0.7 W respectively.

Figure 12:
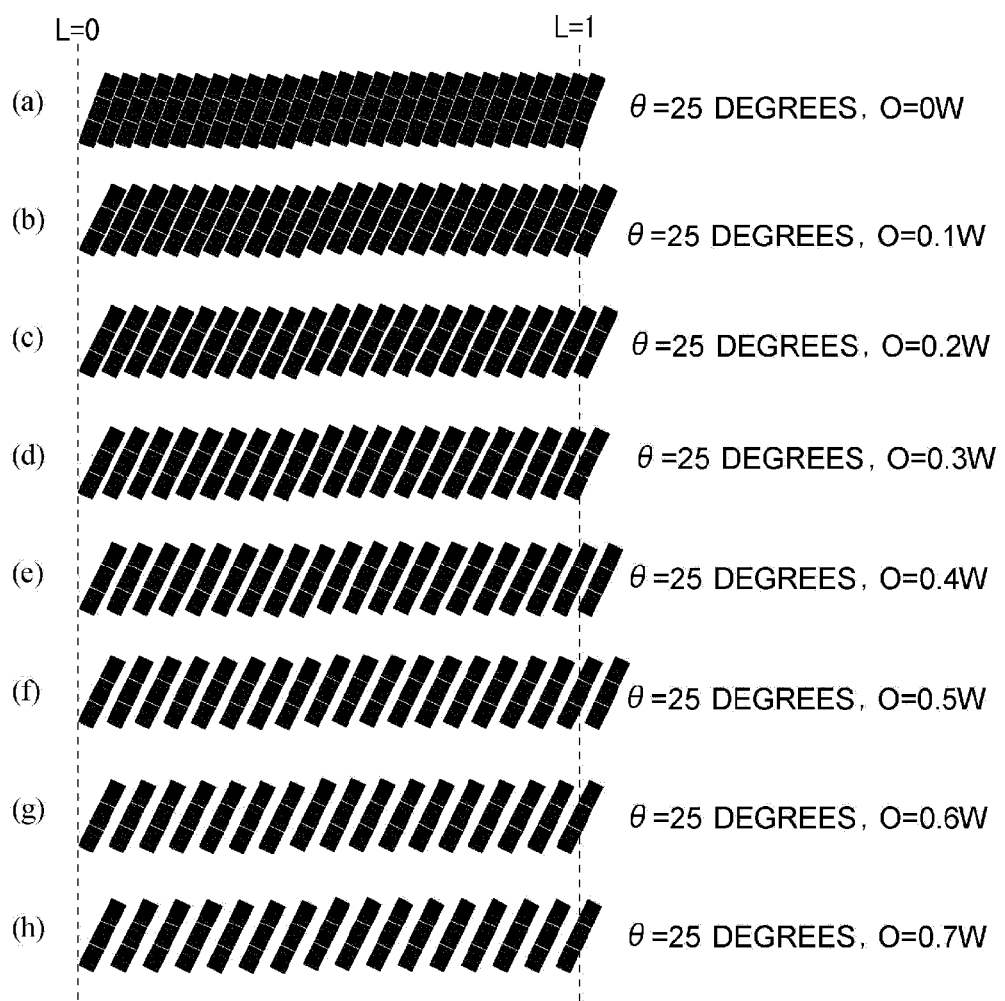
FIG. 12 is a view showing visual relations between level-differences and clearances when the inclination angles of the solar panel group according to the example 2 is 25 degrees.

As shown in FIGS. 8 to 18, it was understood that as the clearance O got larger, the level-difference became more inconspicuous and harder to recognize in the case that the inclination angles θ were between 5 degrees and 55 degrees rightward as well. For example, as shown in FIG. 12, in the case that the inclination angle θ was 25 degrees, when the clearance O was 0 W, it was possible to recognize a level-difference by seeing consciously, but when the clearance O was 0.7 W, it was almost impossible to recognize the level-difference even by seeing consciously.

Accordingly, it was understood that a larger clearance O between the solar panels 21 enabled a level-difference to be inconspicuous, and providing an inclination angle θ made it possible to increase a visual effect that a level-difference in the vertical direction became hard to be recognized.

Example 3

Figure 19:
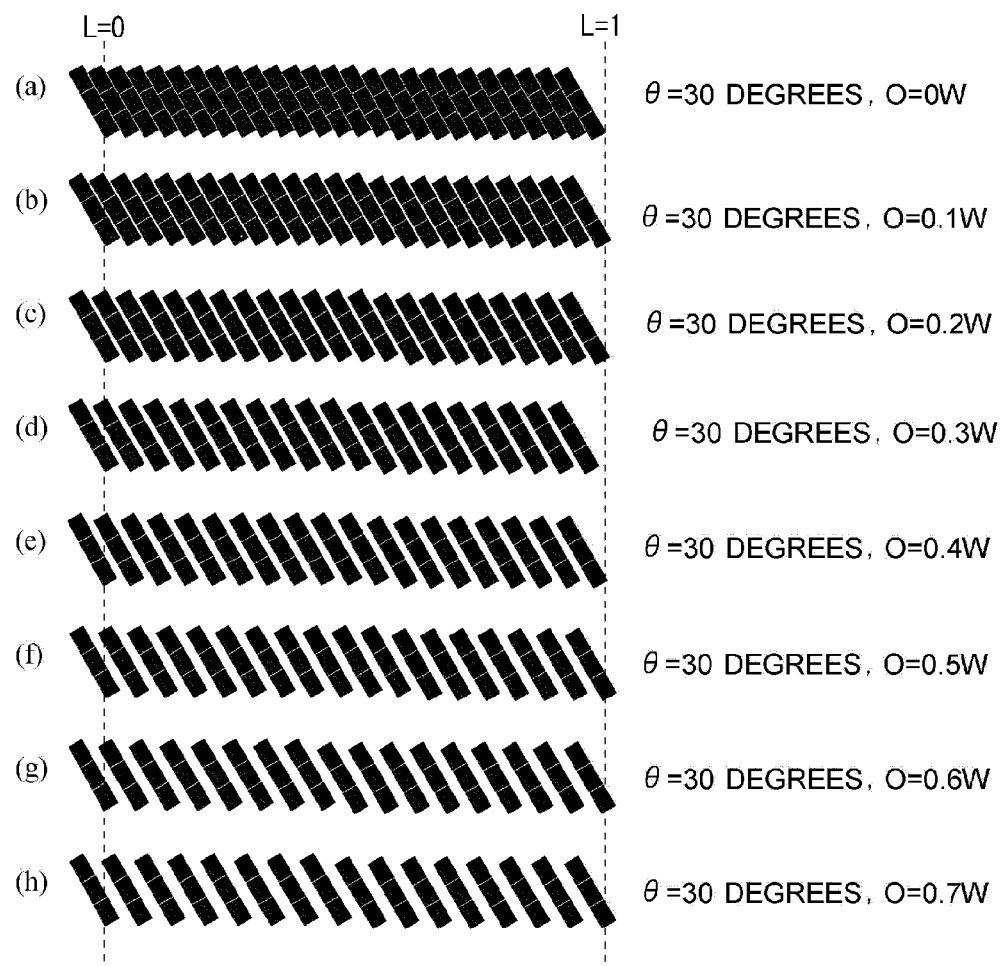
FIG. 19 is a view showing visual relations between level-differences and clearances, when the inclined direction of the solar panel group according to the example 3 is left and inclined angle thereof is 30 degrees.

In an example 3, a study was performed regarding a visual relation on an inclined direction of a solar panel 21. As shown in FIG. 19, the solar panel 21 of the example 3 was same as the solar panel 21 of the above examples 1 and 2, and a solar panel group 2 was formed of the solar panels 21 with aspect ratio 4.5:1 arranged in the horizontal direction. Furthermore, a level-difference of 0.2 W in height, relative to the width W of the solar panel 21, was provided to a nearly center of the solar panel group 2 in the horizontal direction. Furthermore, clearances O between 0 W and 0.7 W in increments of 0.1 W, relative to the width W of the solar panel 21, were included between each of the solar panels 21, 21 . . . . Note that unlike in the above-mentioned examples 1 and 2, the inclined direction was regarded as leftward. In this case, the inclination angle θ was 30 degrees.

Figure 13:
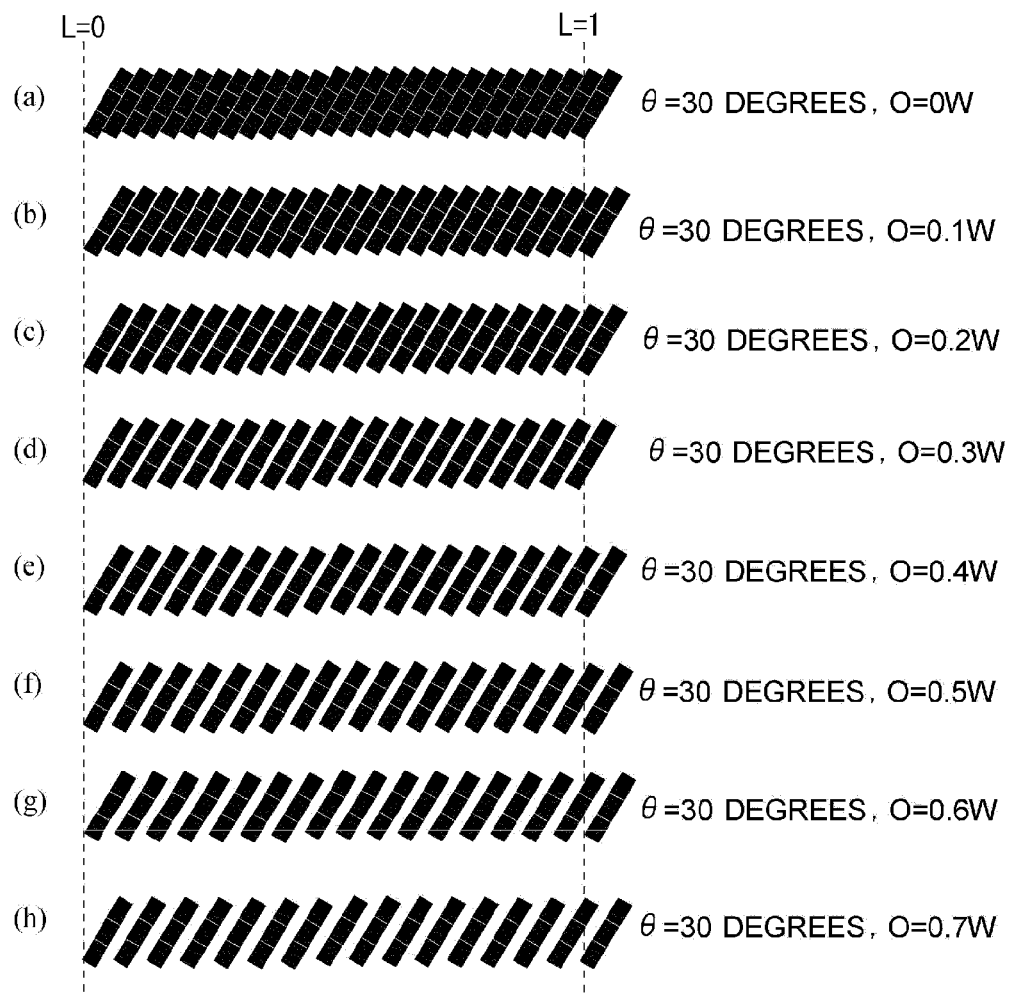
FIG. 13 is a view showing visual relations between level-differences and clearances when the inclination angles of the solar panel group according to the example 2 is 30 degrees.
Figure 14:
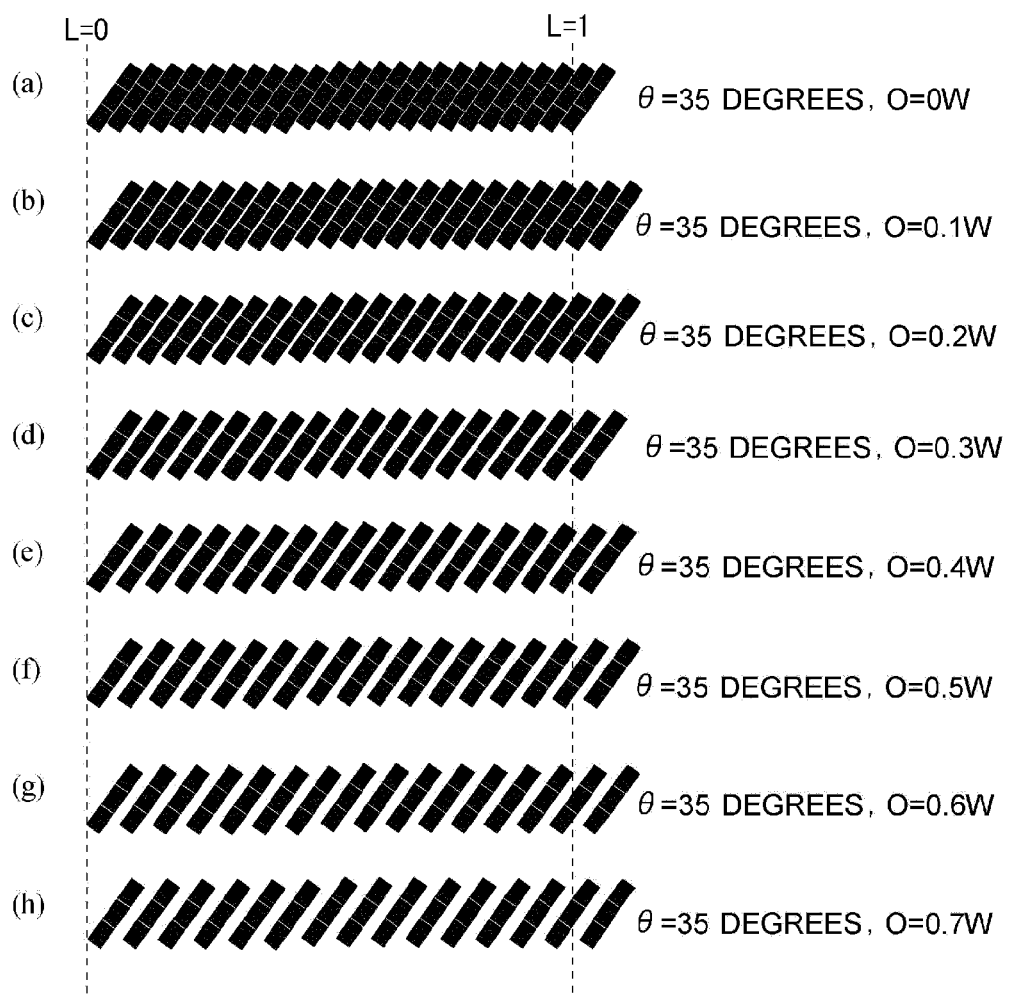
FIG. 14 is a view showing visual relations between level-differences and clearances when the inclination angles of the solar panel group according to the example 2 is 35 degrees.
Figure 15:
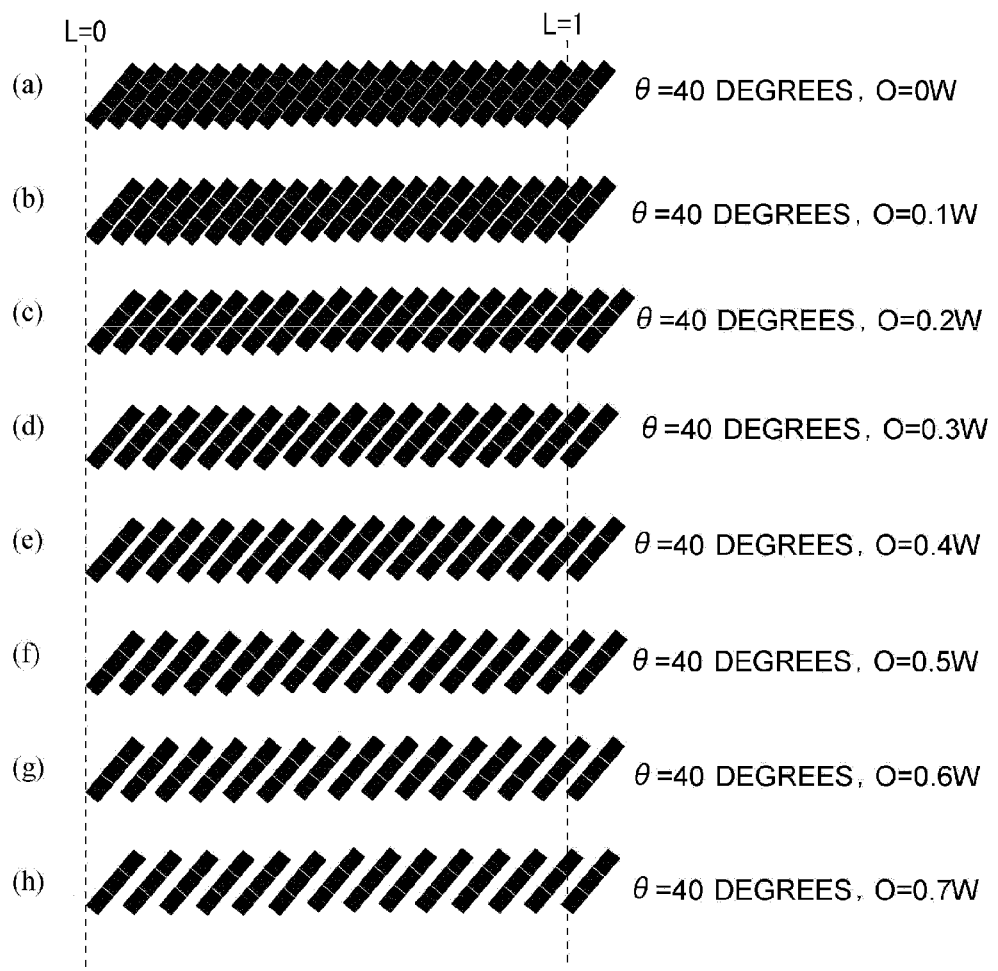
FIG. 15 is a view showing visual relations between level-differences and clearances when the inclination angles of the solar panel group according to the example 2 is 40 degrees.
Figure 16:
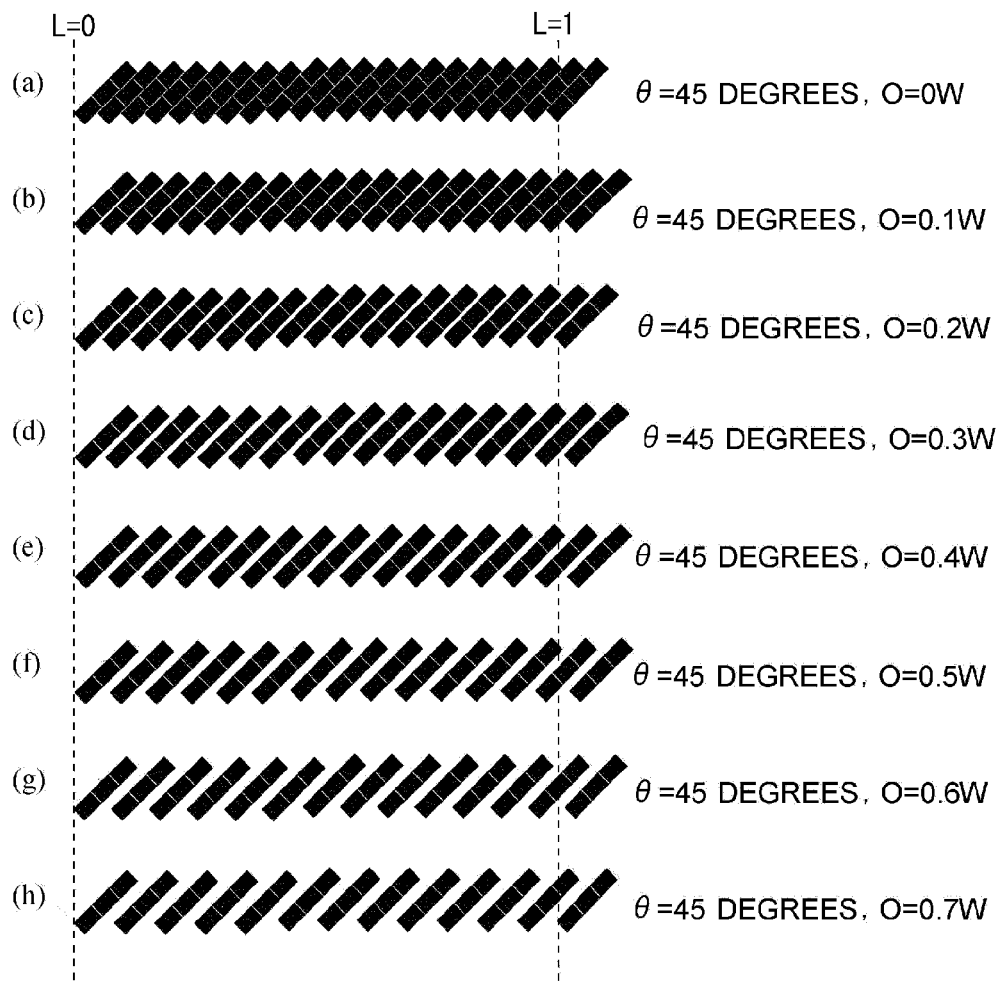
FIG. 16 is a view showing visual relations between level-differences and clearances when the inclination angles of the solar panel group according to the example 2 is 45 degrees.
Figure 17:
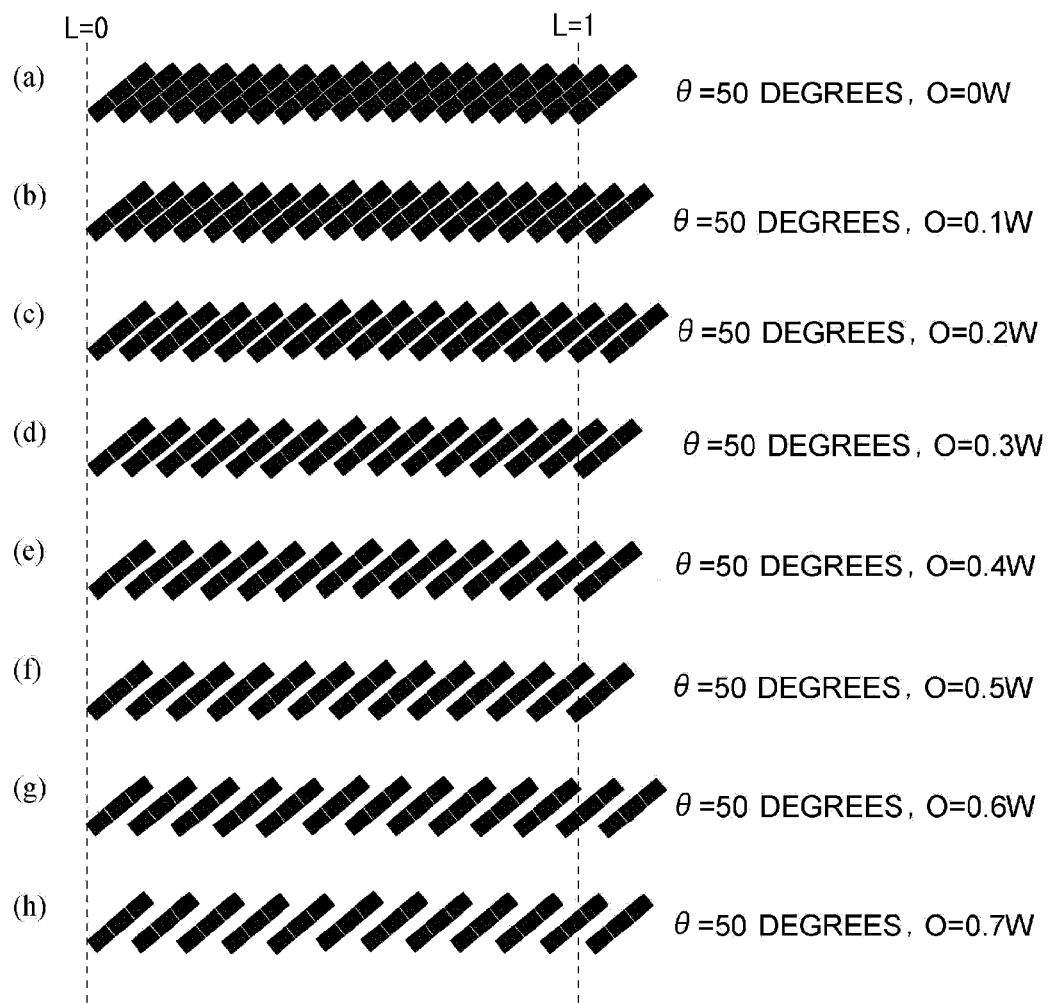
FIG. 17 is a view showing visual relations between level-differences and clearances when the inclination angles of the solar panel group according to the example 2 is 50 degrees.
Figure 18:
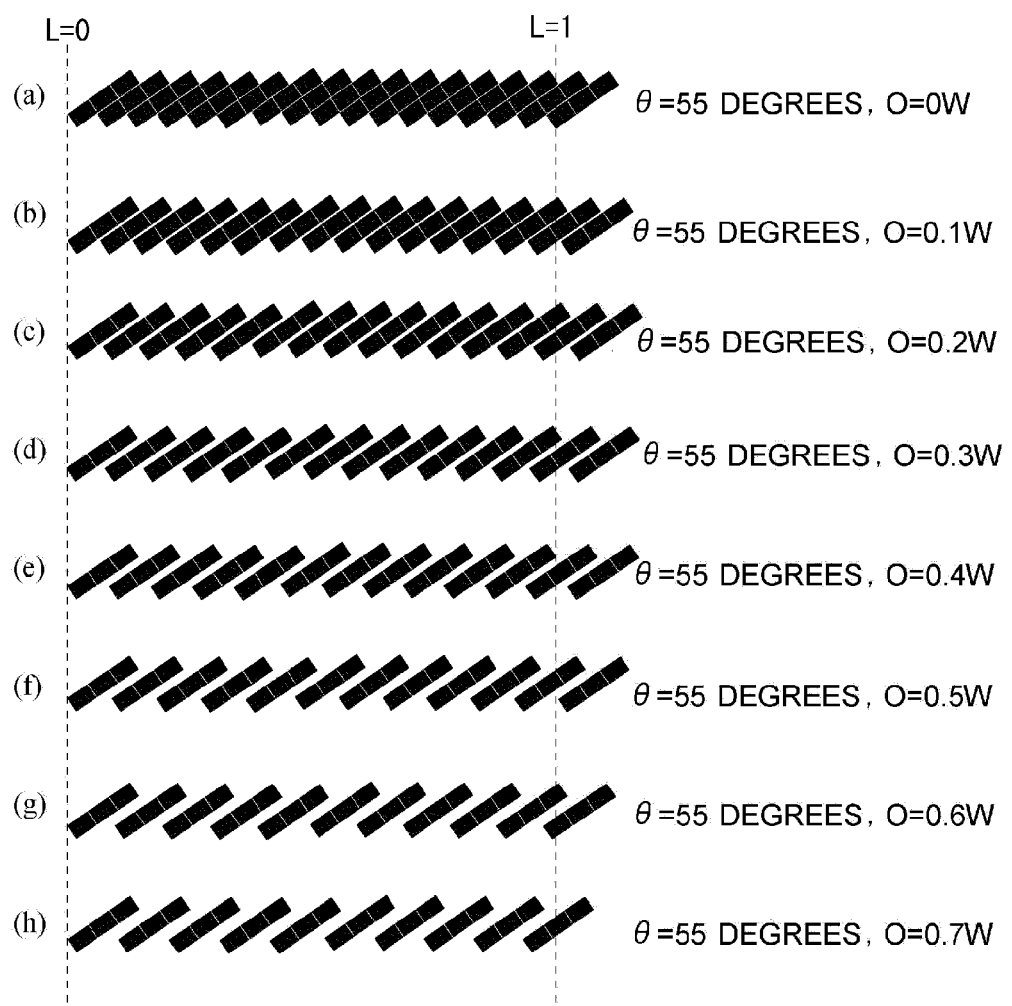
FIG. 18 is a view showing visual relations between level-differences and clearances when the inclination angles of the solar panel group according to the example 2 is 55 degrees.

When FIGS. 19 and 13 with an inclination angle θ 30 degrees and a different inclined direction left or right, were compared, it was understood that even if the inclined direction was different, there was no significant change in a visual effect and the level-difference was inconspicuous in either direction inclined to left or right. As well, providing a clearance O enabled the level-difference to be more inconspicuous.

Accordingly, it was understood from the example 3 that the level-difference was inconspicuous in either direction of the solar panel 21 inclined to left or right.

Example 4

Figure 20:
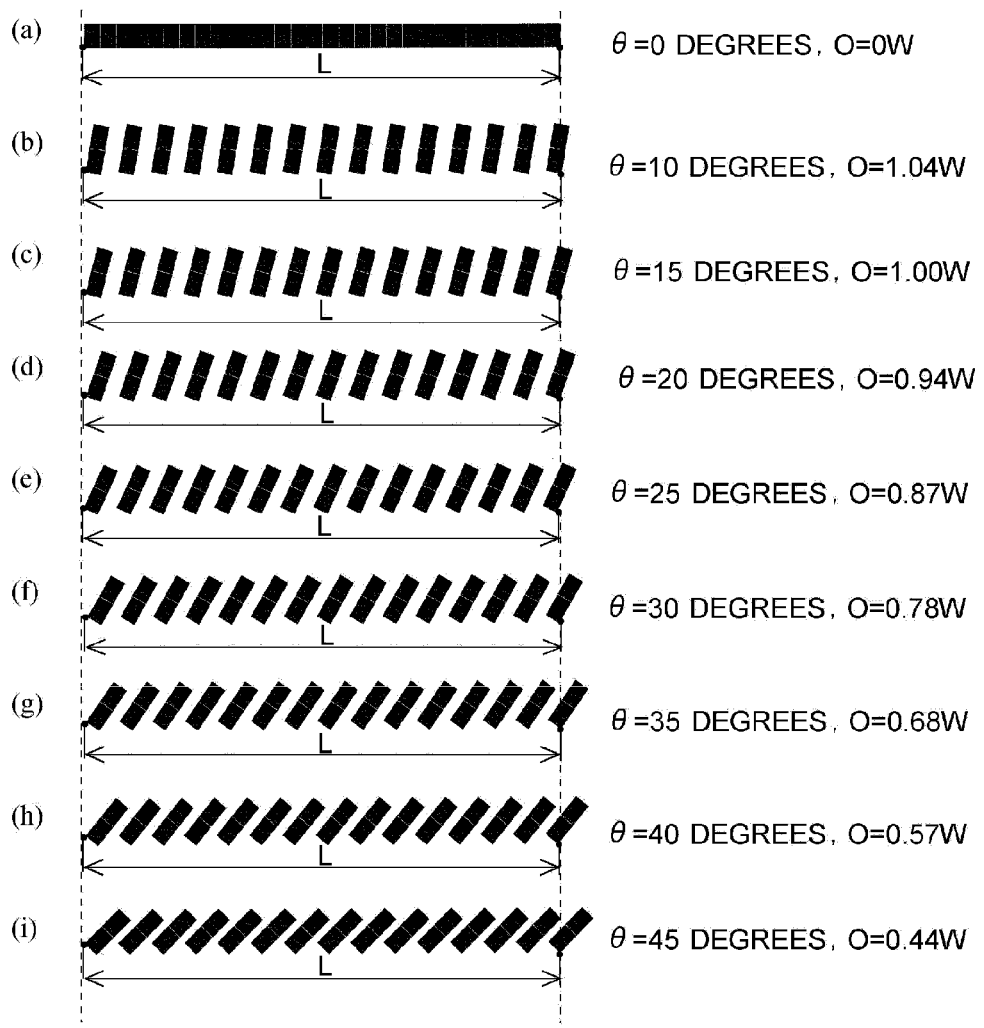
FIG. 20 is a view showing relations between inclination angles and clearances in cases of one stage and two stages in a vertical direction of the solar panel group according to the example 4.

In an example 4, a study was performed regarding an influence that a relation between an inclination angle θ and a clearance O of a solar panel group 2 gave to amount of power generation and horizontal overall installation width. In FIG. 20, (a) denotes a case that 30 sheets of solar panels 21 were horizontally arranged in vertically one row without a clearance, and (b) to (i) denote cases that 15 sets of solar panels 21 were horizontally arranged in vertically two rows. Therefore, (a) to (i) each had the same number of the solar panels 21 and the theoretically same amount of power generation.

Furthermore, in the example 4, all of FIGS. 20(a) to (i) had a same distance L between the bottom-left corner of the leftmost solar panel 21 and the bottom-right corner of the rightmost solar panel 21. In FIGS. 20(b) to (i), the solar panels 21 were inclined with an inclination angle θ between 10 degrees and 45 degrees in increments of 5 degrees.

That is, in the solar panel groups 2 in FIGS. 20(a) to (i) according to the example 4, amount of power generation and the overall installation width were intended to be constant each.

As shown in FIG. 20(c), the clearance O between the solar panels 21 in a case that the inclination angle θ was 15 degrees resulted in 1.0 W relative to the width W of the solar panel 21. Therefore, it was understood that even if the clearance O was provided between each the solar panels 21, 21 . . . , a same number of the solar panels 21 was able to be arranged by increasing the number of the rows in the vertical direction of the solar panels 21 by one row and making the width of the clearance O to be equal to or smaller than 1.0 W. Furthermore, as shown in FIGS. 20(b) to (i), it was also understood that as the inclination angle θ of each of the solar panels 21, 21 . . . got larger, the clearance O became smaller.

Figure 21:
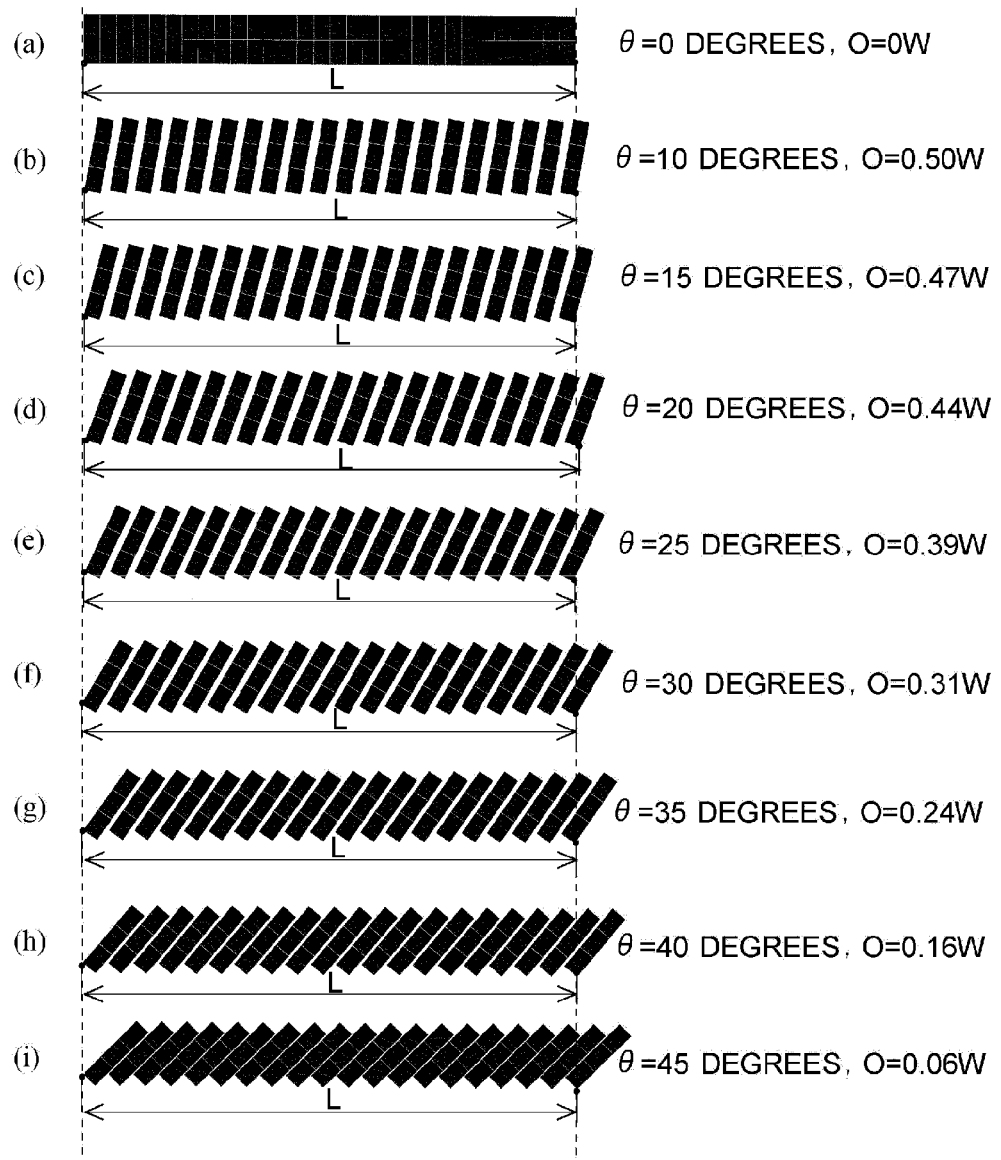
FIG. 21 is a view showing relations between inclination angles and clearances in cases of two stages and three stages in a vertical direction of the solar panel group according to the example 4.

In FIG. 21, (a) denotes a condition that 30 sets of solar panels 21 were horizontally arranged in vertically two rows without a clearance, and (b) to (i) denote conditions that 20 sets of solar panels 21 were horizontally arranged in vertically three rows with a constant distance of clearance O.

In FIG. 21(b), the clearance O between the solar panels 21 in a case that the inclination angle θ was 10 degrees was 0.5 W relative to the width W of the solar panel 21. It was understood that when a same number of the solar panels 21 were intend to be arranged with respect to the width of a predetermined installation location, changing the number of the rows from two to three might require a smaller clearance O than changing from one to two.

Furthermore, as shown in FIGS. 21(b) to (i), as the inclination angle θ of each of the solar panels 21, 21 . . . got larger, the clearance O became smaller. In particular, in FIG. 21(i), the clearance O between the solar panels 21 in a case that the inclination angle θ was 45 degrees resulted in 0.06 W relative to the width W of the solar panel 21, and in a case of equal to or larger than 50 degrees, the solar panels 21 resulted in overlapping each other.

Figure 22:
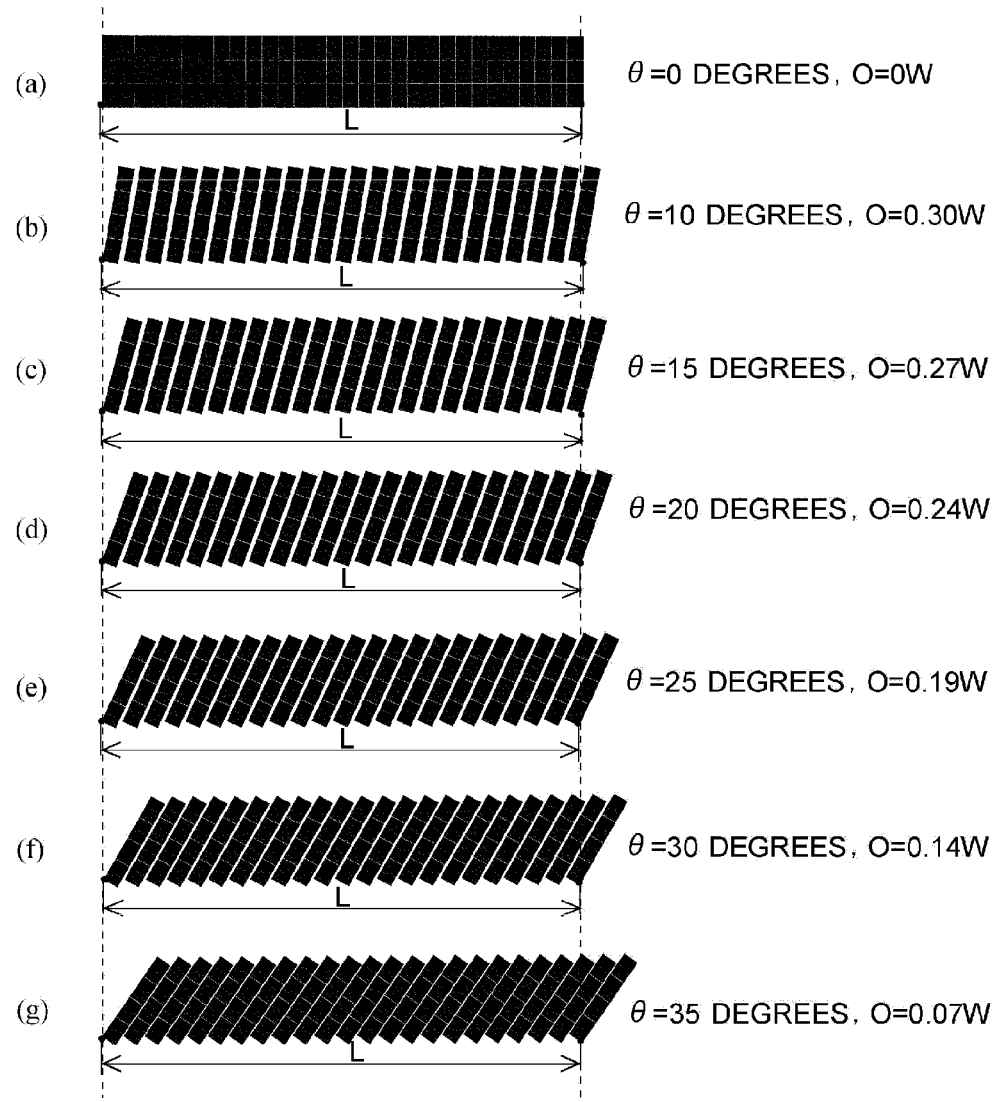
FIG. 22 is a view showing relations between inclination angles and clearances in cases of three stages and four stages in a vertical direction of the solar panel group according to the example 4.

In FIG. 22, (a) denotes a condition that 30 sets of solar panels 21 were horizontally arranged in vertically three rows without a clearance, and (b) to (g) denote conditions that 23 sets of solar panels 21 were horizontally arranged in vertically four rows with a constant distance of clearance O.

In this case, as shown in FIG. 22(g), the clearance O between the solar panels 21 in a case that the inclination angle θ was 35 degrees resulted in 0.07 W relative to the width W of the solar panel 21, and in a case of the inclination angle θ equal to or larger than 40 degrees, the solar panels 21 resulted in overlapping each other.

Accordingly, it was understood that the clearance O between each of the solar panels 21 was able to be formed as maintaining amount of power generation by making the clearance O to be equal to or smaller than 1.0 W relative to the width W of the solar panel 21. Therefore, it indicates that the installation location did not have to be expanded more than necessary by making the clearance O to be equal to or smaller than 1.0 W. It was also understood that the clearance O between each of the solar panels 21 was able to be formed on the predetermined installation location by making the inclination angle θ to be equal to or smaller than 45 degrees.

Example 5

In an example 5, solar panels 21 were actually arranged on a frame that was installed using a simple foundation construction method, and a study was performed regarding level-differences in a vertical direction and level-differences of the inclined face, differences in an inclination angle θ and differences in a clearance O with respect to construction accuracy were how far recognized.

First, design dimensions etc. for the frame 3 and the solar panel 21 used in the example 5 are described.

Figure 23:
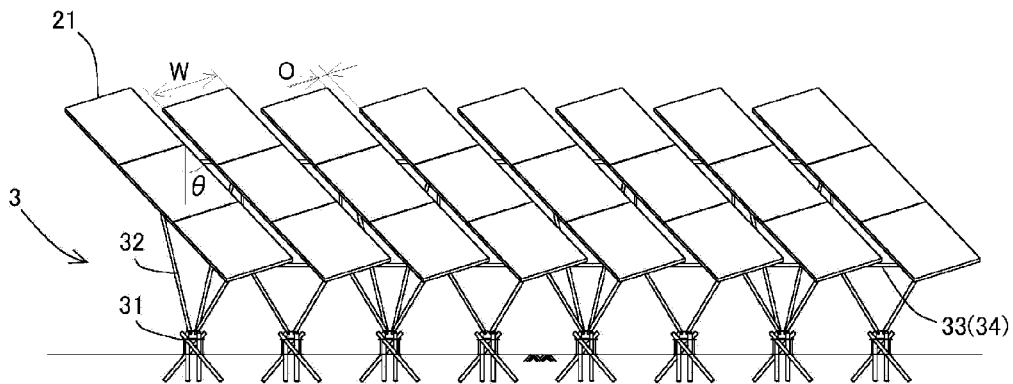
FIG. 23 is a front view showing designed solar panels and frames according to the example 5.

As shown in FIG. 23, a base portion 31 according to the example 5, which was a foundation based on a simple foundation construction method using a spherical foundation formed of metal etc., was installed on a horizontally leveled ground and fixed with a plurality of pipe-shaped stakes.

A frame body 32 was formed of a frame structure by a plurality of pipes. Each pipe was connected by welding or bolting.

Panel installation rails 33 were configured of two rails arranged vertically side by side. An inclination angle of an inclination portion 34 formed by the panel installation rails 33 was 35 degrees.

As shown in FIG. 23, the solar panels 21 according to the example 5 were unitized by arranging consecutive three sheets in a vertical direction and by fixing the back side of a panel with a shaft made of a square pillar. The unitized solar panel 21 has dimensions of 4496 mm in height and 992 mm in width, and approximately 4.5:1 in aspect ratio.

The solar panels 21 were installed by arranging eight sheets in a horizontal direction so that the heights of the panels became equal with respect to the plane formed of the panel installation rails 33. The clearance O between each of the solar panels 21 was 151 mm and was equal to or smaller than the width W of the solar panel 21. Furthermore, each of the solar panels 21 is inclined leftward and the inclination angle θ was 43.4 degrees.

Next, level-differences and differences in an inclination angle θ in a case that the frame 3 and the solar panel 21 designed as above were constructed on a leveled piled soil.

Figure 24:
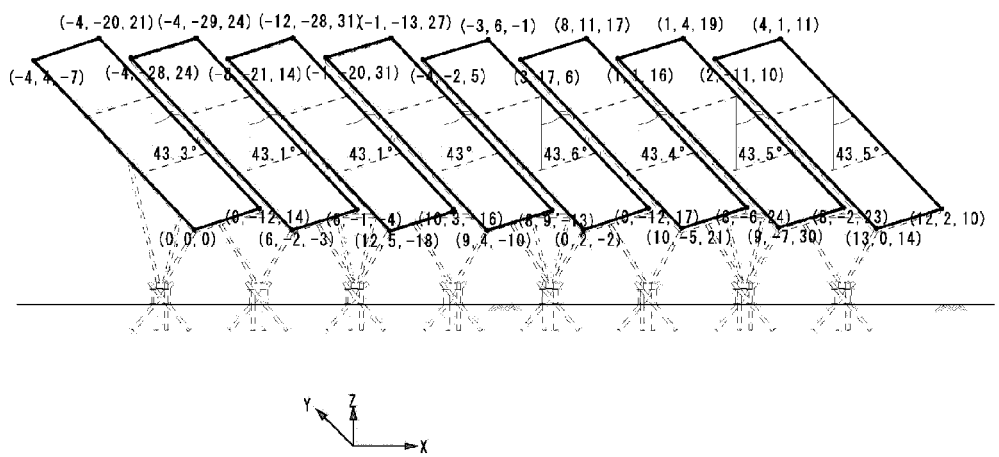
FIG. 24 is a front view showing coordinate values for the four corners and inclination angles of constructed solar panels according to the example 5.

In the example 5, as shown in FIG. 24, it was performed to measure how long in distance mm four corners of each of the solar panels 21 misaligned with respect to the designed locations when a reference point was set to the bottom-left corner of the solar panel 21 installed at leftmost position.

First, the solar panel 21 installed at leftmost position is described. As shown in FIG. 24, X-coordinate values of the bottom-left and bottom-right corners of the relevant solar panel 21 were both 0 mm, which were not misaligned with respect to the designed locations. On the other hand, X-coordinate values of the top-left and top-right corners were both −4 mm, which were misaligned with respect to the designed locations by 4 mm leftward.

Furthermore, Z-coordinate value of the bottom-right corner was 14 mm, which was misaligned with respect to the designed location by 14 mm upward. Furthermore, Z-coordinate value of the top-right corner was 21 mm, which was misaligned with respect to the designed location by 21 mm upward. On the other hand, Z-coordinate value of the top-left corner was −7 mm, which was misaligned with respect to the designed location by 7 mm downward.

That is, the solar panel 21 installed at leftmost position was inclined to a direction of rotating counterclockwise on a center of the Y-axis around the bottom-left corner with respect to the designed location.

Furthermore, Y-coordinate value of the bottom-right corner was −12 mm, which was misaligned with respect to the designed location by 12 mm to the near side. Furthermore, Y-coordinate value of the top-right corner was −20 mm, which was misaligned with respect to the designed location by 20 mm to the near side. Meanwhile, Y-coordinate value of the top-left corner was 4 mm, which was misaligned with respect to the designed location by 4 mm to the far side.

That is, the relevant solar panel 21 was inclined to a direction of rotating counterclockwise on a center of the Z-axis and rotating clockwise on a center of the X-axis around the bottom-left corner with respect to the designed location.

Moreover, inclination angles θ were calculated based on each coordinate value of the four corners of the solar panels 21. As shown in FIG. 24, the inclination angle θ created by the bottom-right corner and the top-right corner is 43.3 degrees, which was 0.1 degree smaller than the designed value 43.4 degrees for the inclination angle θ.

Therefore, it was understood that level-differences in left, right and vertical directions and level-differences in the inclined face and differences in the inclination angles θ compared with designed dimensions etc. were caused in the solar panel 21 according to the example 5. Furthermore, such level-differences and differences are not same on each of the solar panels 21, which resulted in that each of the solar panels 21 was installed in a distorted status.

Furthermore, the fourth and fifth panels from the left out of all the solar panels 21 included the largest relative level-difference and the largest difference in the inclination angle θ.

To put it concretely, as shown in FIG. 24, Z-coordinate value of the top-right corner of the fourth solar panel 21 from the left was 27 mm, which indicated that this panel was misaligned by 27 mm upward, while Z-coordinate value of the top-right corner of the fifth solar panel 21 from the left was −1 mm, which indicated that this panel was misaligned by 1 mm downward. That is, the level-difference between the fourth and the fifth solar panels 21 from the left was 28 mm.

Furthermore, the inclination angle θ of the fourth solar panel 21 from the left was 43 degrees, while that of the fifth solar panel 21 from the left was 43.6 degrees. Therefore, the difference of the inclination angle θ between each of the solar panels 21 was 0.6 degrees.

Figure 25:
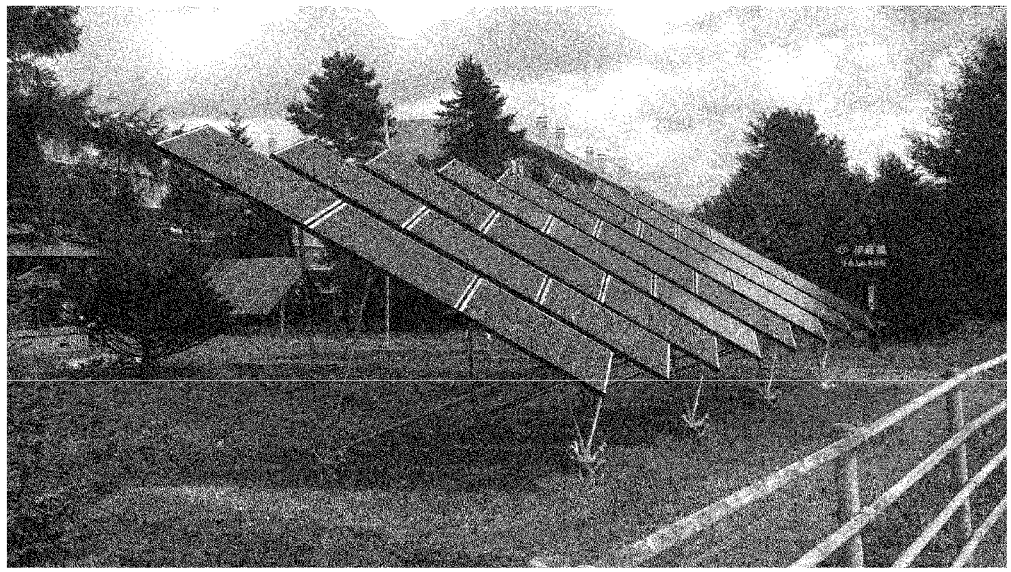
FIG. 25 is a digital photo image of the constructed solar panels according to the example 5 shot from the front left.
Figure 26:
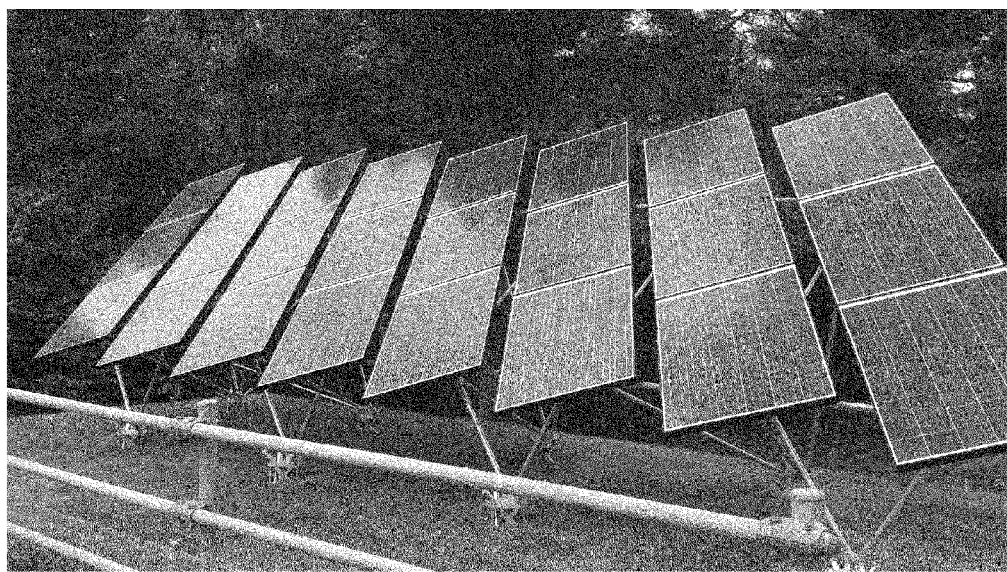
FIG. 26 is a digital photo image of the constructed solar panels according to the example 5 shot from the front right.

Next, a study was performed regarding a digital photo image of the solar panels 21 actually constructed in the example 5. As a result, as shown in FIGS. 25 and 26, a level-difference in the vertical direction and a level-difference of the inclined face, and a difference in the inclination angle θ were almost impossible to recognize visually. In particular, it was possible to be visually recognized in a way that even the fourth and fifth solar panels 21 from the left with the relatively largest level-difference and inclination angle θ were arranged in an orderly manner. In addition, differences in the inclination angles θ of each of the solar panels 21 and the clearances O between the solar panels 21 were also not constant, but such differences were almost impossible to recognize visually.

Accordingly, in the solar panel 21 according to the example 5, not only level-differences in the vertical direction and level-differences of the inclined face but also differences of the inclination angles θ and the clearances O between the solar panels 21 were actually almost impossible to recognize visually even if there were such differences. Rather than above, as shown in FIGS. 25 and 26, each of the solar panels 21 can be seen arranged regularly with an unprecedented functional beauty and can be said to be arranged in a beautiful order at sight.

Note that the installation method of the solar power system 1 and the solar panel 21 according to the present invention is not limited to the above-mentioned embodiment but modifications may be made to the embodiment as appropriate.

For example, not shown, the solar power system 1, may configure a mega solar system by arranging a plurality of solar panel groups 2 in left-right direction and/or in the front-back direction. Furthermore, when a plurality of solar panel groups 2, 2 . . . are installed, the inclination angle θ and/or the inclined direction of each of the solar panel groups 2, 2 . . . may be different.

In addition, as shown in FIG. 5, when installed on an area having ups and downs of hilly area etc., the solar panel group 2B may be installed so that each of the solar panels 21, 21 . . . has level-differences in the vertical direction in a way to draw a curve along the geographical shape.

REFERENCE SIGNS LIST

1 solar power system
2 solar panel group
3 frame
4 current collector
21 solar panel
22 lighting face
31 base portion
32 frame body
33 panel installation rail
34 inclination portion
41 junction box
42 power conditioner
θ inclination angle
O clearance
W width of a solar panel

The invention claimed is:

1. A solar power system comprising
a frame structure that is installed on the ground, the frame structure having a front tip portion (32*ft*) and a back tip portion (32*bt*), wherein the front tip portion is positioned in front of and lower than the back tip portion, at least two horizontally arranged, parallel rails, and a light facing plane (34), the light facing plane
being an imaginary plane that is intended to be set to face the sun such that the front tip portion and back tip portion define the plane in a depth direction (Y) and a height direction (Z), and the at least two rails define the plane in the height direction and a width direction (X), and
being angled by a predetermined angle (α) with respect to the depth direction, which is horizontal and a front-back direction of the frame structure,
a plurality of vertically oriented rectangular solar panels that have a substantially identical shape and are arranged at substantially the same height on the light facing plane of the frame structure in a single row in the width direction, which is horizontal and a lateral direction of the frame structure, wherein
each of the solar panels has a first face intended to face the sun and is physically separated from one of the solar panels that it is adjacent to with a clearance (O) that is equal to or smaller than a width (W) of the solar panels such that all of the first faces of the plurality of solar panels are parallel to the light facing plane,
the solar panels are inclined to a same direction either left or right at a predetermined inclination angle (θ) with respect to the height direction, the inclination angle being defined as an angle seen from a view, which is parallel to the depth direction, facing to the front of the frame structure, and
the inclination angle (θ) is ranged from 15 degrees to 45 degrees.

2. The solar power system according to claim 1, wherein the at least two rails comprise one rail being a lower rail positioned at the front tip portion and another rail being an upper rail positioned at the back tip portion, and the solar panels are placed on the lower rail and the upper rail.

3. The solar power system according to claim 1, wherein the light facing plane is in a linear plane shape.

4. The solar power system according to claim 1, wherein a ratio of a longitudinal length per a lateral length of each of the solar panels is ranged from 4.5 to 6.0, and
a ratio of the clearance per the width of the solar panels is ranged from 0.1 to 0.7.

5. An installation method of solar panels using a frame structure, the solar panels having a substantially identical shape, comprising
installing a frame structure on the ground, the frame structure having a front tip portion and a back tip portion, wherein the front tip portion is positioned in front of and lower than the back tip portion, at least two horizontally arranged, parallel rails, and a light facing plane that is an imaginary plane intended to be set to face the sun, the front tip portion and back tip portion defining the plane in a depth direction (Y) and a height direction (Z), and the at least two rails define the plane in the height direction and a width direction (X), and being angled by a predetermined angle ($\alpha$) with respect to the depth direction, which is horizontal and a front-back direction of the frame structure,
arranging the solar panels on the light facing plane in a single row in the width direction, which is a horizontal and a lateral direction of the frame structure, and at a substantially the same height in a manner that longer sides of each of the solar panels are vertically oriented, wherein
each of the solar panels has a first face intended to face the sun and is physically separated from one of the solar panels that it is adjacent to with a clearance (O) that is equal to or smaller than a width (W) of the solar panels, such that all of the first faces of the plurality of solar panels are parallel to the light facing plane,
the solar panels are inclined to a same direction either left or right at a predetermined inclination angle ($\theta$) with respect to the height direction, the inclination angle being defined as an angle seen from a view, which is parallel to the depth direction, facing to the front of the frame structure, and
the inclination angle ($\theta$) is ranged from 15 degrees to 45 degrees.

6. The installation method according to claim 5, wherein the at least two rails comprise one rail being a lower rail positioned at the front tip portion and another rail being an upper fail positioned at the back tip portion, and
the solar panels are placed on the lower rail and the upper rail.

7. The installation method according to claim 5, wherein the light facing plane is in a linear plane shape.

8. The installation method according to claim 5, wherein a ratio of a longitudinal length per a lateral length of each of the solar panels is ranged from 4.5 to 6.0, and
a ratio of the clearance per the width of the solar panels is ranged from 0.1 to 0.7.

9. A solar power unit that is composed with a frame structure and a plurality of rectangular solar panels, comprising
a frame structure that is to be installed on the ground, having a front tip portion and a back tip portion, wherein the front tip portion is positioned in front of and lower than the back tip portion, at least two horizontally arranged, parallel rails, and a light facing plane, the light facing plane
being an imaginary plane that is intended to be set to face the sun such that the front tip portion and back tip portion define the plane in a depth direction (Y) and a height direction (Z), and the at least two rails define the plane in the height direction and a width direction (X), and
being angled by a predetermined angle ($\alpha$) with respect to the depth direction, which is horizontal and a front-back direction of the frame structure,
the solar panels that have a substantially identical shape and are to be arranged at substantially the same height on the light facing plane of the frame structure in a single row in the width direction, which is horizontal and a lateral direction of the frame structure, in a manner that a longer side of each of the solar panels is vertically oriented, wherein
each of the solar panels has a first face intended to face the sun and is arranged to be physically separated from one of the solar panels that it is adjacent to with a clearance (O), of which a ratio per width of the solar panels is ranged from 0.1 to 0.7 such that all of the first faces of the plurality of solar panels are parallel to the light facing plane,
the solar panels are inclined to a same direction either left or right at a predetermined inclination angle ($\theta$) with respect to the height direction, the inclination angle being defined as an angle seen from a view, which is parallel to the depth direction, facing to the front of the frame structure and perpendicular to the gravity direction, and
the inclination angle ($\theta$) is ranged from 15 degrees to 45 degrees.

10. The solar power unit according to claim 9, wherein the at least two rails comprise one rail being a lower rail positioned at the front tip portion and another rail being an upper rail positioned at the back tip portion, and
the solar panels are placed on the lower rail and the upper rail.

11. The solar power unit according to claim 9, wherein the light facing plane is in a linear plane shape.

12. The solar power unit according to claim 9, wherein a ratio of a longitudinal length per a lateral length of each of the solar panels is ranged from 4.5 to 6.0.

* * * * *